(12) United States Patent
Fall et al.

(10) Patent No.: US 9,735,602 B2
(45) Date of Patent: Aug. 15, 2017

(54) ENERGY CONVERTING APPARATUS AND METHOD

(75) Inventors: Mohamed Papa Talla Fall, Ifs (FR); Sami Ajram, Gardanne (FR)

(73) Assignee: Mohamed Papa Talla Fall, Ifs (FR)

( * ) Notice: Subject to any disclaimer, the term of this patent is extended or adjusted under 35 U.S.C. 154(b) by 930 days.

(21) Appl. No.: 13/982,018

(22) PCT Filed: Jan. 18, 2012

(86) PCT No.: PCT/EP2012/000223
§ 371 (c)(1),
(2), (4) Date: Oct. 10, 2013

(87) PCT Pub. No.: WO2012/100924
PCT Pub. Date: Aug. 2, 2012

(65) Prior Publication Data
US 2014/0111015 A1    Apr. 24, 2014

(30) Foreign Application Priority Data
Jan. 26, 2011   (EP) .................................... 11290046

(51) Int. Cl.
*H02J 7/00*    (2006.01)
*H01L 31/02*   (2006.01)
(Continued)

(52) U.S. Cl.
CPC ...... *H02J 7/0072* (2013.01); *H01L 31/02021* (2013.01); *H02J 7/0019* (2013.01);
(Continued)

(58) Field of Classification Search
CPC .................................................. H02J 7/0072
(Continued)

(56) References Cited

U.S. PATENT DOCUMENTS 4,175,249 A * 11/1979 Gruber ...................... G05F 1/67
                                                                  136/293
4,873,480 A * 10/1989 Lafferty .................... G05F 1/67
                                                                  136/293
(Continued)

FOREIGN PATENT DOCUMENTS

CN     101443672 A    5/2009
EP     1 528 652 A2   5/2005
(Continued)

OTHER PUBLICATIONS

International Search Report for Application No. PCT/EP2012/000223; dated Jul. 11, 2012.
(Continued)

*Primary Examiner* — Joseph Chang
(74) *Attorney, Agent, or Firm* — Alston & Bird LLP

(57) ABSTRACT

The present invention relates to an energy converter for converting energy received from at least one energy source, wherein the at least one energy source includes a first photovoltaic generator, wherein the energy converter is configured to be connected to a second photovoltaic generator; the energy converter further includes a sensing unit configured to sense an open circuit voltage (VPVSS) of the second photovoltaic generator; and the energy converter is configured to convert energy received from the first photovoltaic generator based on the open voltage circuit sensed by the sensing unit. Moreover, the present invention relates to an energy conversion and storage system including the energy converter and least one energy storage element.

15 Claims, 14 Drawing Sheets

(51) Int. Cl.
  *H02J 7/35* (2006.01)
  *H02J 7/34* (2006.01)
  *H02M 3/04* (2006.01)

(52) U.S. Cl.
  CPC ............ *H02J 7/0063* (2013.01); *H02J 7/345* (2013.01); *H02J 7/35* (2013.01); *H02M 3/04* (2013.01); *H02J 2007/0067* (2013.01); *Y02E 10/566* (2013.01); *Y10T 307/625* (2015.04)

(58) Field of Classification Search
  USPC .......................................................... 307/84
  See application file for complete search history.

(56) References Cited

U.S. PATENT DOCUMENTS

| | | | |
|---|---|---|---|
| 5,644,219 | A | 7/1997 | Kurokawa |
| 7,030,597 | B2 | 4/2006 | Bruno et al. |
| 2005/0083014 | A1 | 4/2005 | Baumgartner |
| 2005/0093514 | A1 | 5/2005 | Shimizu |
| 2008/0111517 | A1 | 5/2008 | Pfeifer et al. |
| 2009/0072788 | A1 | 3/2009 | Delaille et al. |
| 2010/0149847 | A1 | 6/2010 | Kernahan |
| 2010/0264732 | A1 | 10/2010 | Beck |

FOREIGN PATENT DOCUMENTS

| | | |
|---|---|---|
| EP | 2 099 112 A2 | 9/2009 |
| FR | 2 879 852 A1 | 6/2006 |
| FR | 2 901 070 A1 | 11/2007 |
| WO | WO-03/017446 A1 | 2/2003 |
| WO | WO 2005/036713 A1 | 4/2005 |
| WO | WO-2005/069096 AI | 7/2005 |
| WO | WO-2007/082168 A2 | 7/2007 |
| WO | WO-2008/072266 A1 | 6/2008 |

OTHER PUBLICATIONS

Extended European Search Report for corresponding European Application No. 11290046.9 dated Dec. 16, 2011, 14 pages.
Extended European Search Report for corresponding European Application No. 13154270.6 dated Feb. 9, 2015, 7 pages.
Partial European Search Report for corresponding European Application No. 11290046.9 dated Jul. 28, 2011, 7 pages.
Search Report for Chinese Application No. 201280067833.
Written Opinion for International Application No. PCT/EP2012/000223, dated Jul. 11, 2012.

\* cited by examiner

ENERGY CONVERTING APPARATUS AND METHOD

FIELD OF THE INVENTION

The present invention relates to the field of energy harvesting, conversion and storing. More specifically, the present invention relates to an energy converter and to an energy conversion and storage system.

Recently, harvesting energy from the environment has become the subject of much research. Thanks to energy harvested from the environment, it is possible to power portable devices without the need for the user to recharge batteries or without a connection to a power source via a cable. Moreover, if the harvested energy is a form of renewable energy, no pollution is created by the operation of such devices. Among the different ways of harvesting energy from the environment, there are photovoltaic generators, piezoelectric generators and thermoelectric generators.

In order to fit generators small enough within a portable device, their conversion efficiency should be high. For instance, with a state of the art photovoltaic generator it is possible to obtain energy a conversion efficiency of up to 40%. With cheaper technologies such conversion factor is in the range of 20% to 25%. Moreover, the total power which can be harvested from a photovoltaic cell also depends on the power density of the incident light. For instance, a 5×5 cm$^2$ solar cell could provide 200 mW up to 1000 mW when receiving direct sunlight and 200 uW up to 1 mW or 10 mW when operating indoors. The photovoltaic cell operates as a current generator or as a voltage generator having an output impedance which is subjected to large variations as a function of the load and of the solar power received. Moreover, the output voltage generated by the photovoltaic cell varies as a function of the temperature.

In order to achieve the highest possible conversion efficiency for a photovoltaic generator, it is known to continuously adapt the load impedance. This approach is known as MPPT (maximum power point tracking). FIG. 14 illustrates the output current 9001 as a function of the output voltage for a photovoltaic cell, as well as the output power 9002 generated by such a photovoltaic cell. As can be seen in FIG. 14, the maximum power is delivered when the output voltage is lower than the maximum voltage achieved by the photovoltaic cell, namely the open circuit voltage 9003. It is found that power 9002 has a peak when the photovoltaic cell is operated so that the output voltage is in the range of 15% to 20% below the open circuit voltage value.

Accordingly, in order to improve exploitation of the power harvested by the photovoltaic cell, the output voltage of the photovoltaic cell should be maintained in a range of 5% to 35%, preferably 15 to 20%, below the open circuit voltage, which will vary according to the incident photovoltaic power. The MPPT technique achieves such a goal.

However, the MPPT technique is applicable only when there is enough power available for driving the electronic circuits in charge of the MPPT technique. On the other hand, when the available power is low the power consumption is higher than the harvested energy. Accordingly, such a solution is not meaningful for low power application.

It is therefore an object of the present invention to provide an energy converter capable of converting energy from at least one photovoltaic generator so as to ensure improved efficiency, by using a simple design so as to consume less power.

The present invention can relate to an energy converter, connectable to at least one first generator, for converting energy received from the at least one first generator, wherein the energy converter is connectable to a second generator; the energy converter can further include a sensing unit configured to sense an output value of the second generator which allows the estimation of the open circuit voltage of the first generator; and the energy converter is configured to convert energy received from the first generator based on the open circuit voltage estimated by the sensing unit.

Thanks to such approach, the energy converter of the present invention is capable of converting energy received from the first photovoltaic generator with high efficiency while consuming a reduced amount of power thanks to a simple architecture.

In some embodiments of the present invention, the sensed output value of the second generator can be the open circuit voltage value of the second generator.

By measuring the open circuit voltage of the second generator, the open circuit voltage of the first generator can be readily determined. Based on this determination, an optimized output voltage of the first generator can be determined.

In some embodiments of the present invention, the sensing unit can be configured to output an optimized voltage corresponding to a value in a range of 5% to 35%, preferably 15% to 20%, less than the sensed open circuit voltage, and the energy converter is configured to maintain an output voltage of the first generator to a value corresponding to the optimized voltage.

By choosing such a range of values for the optimized voltage, the first generator can operate with high efficiency.

In some embodiments of the present invention, the energy converter can further comprise a converter among any of a boost converter, a buck converter, and a buck-boost converter, controlled by a controller, configured to convert the output voltage of the first generator to an output voltage of the energy converter corresponding to a predetermined reference voltage.

Thanks to the converter, it becomes possible to convert the voltage output by the first generator to a value more suitable for the desired applications.

In some embodiments of the present invention, the energy converter can further comprise a priority arbitrator configured to receive a first error signal, output by a first comparator, indicating the difference between the optimized voltage and the output voltage of the first generator; receive a second error signal, output by a second comparator, indicating the difference between the reference voltage and the output voltage of the energy converter; and to output a control signal to the controller, thereby driving the converter, so as to ensure that the second error signal is minimized if the first error signal is within a predetermined range, indicating that the first generator is capable of providing as much power as required by the converter, ensure that the first error signal is minimized if the first error signal is detected outside the predetermined range.

Thanks to the priority arbitrator, it is possible to ensure that the output voltage of the energy converter follows the reference voltage whenever enough power is available at the input of the energy converter. At the same time, it is possible to ensure that power generation by the first generator is maintained at the maximum possible value.

In some embodiments of the present invention, the energy converter can further be connected to at least one energy storage element.

Using an energy storage element one can store excess energy and recover required energy depending on the energy provided by the first generator and the energy required by the load.

In some embodiments of the present invention, the at least one energy storage element can include at least one battery and or a super-capacitor.

In some embodiments of the present invention, the energy converter can further comprise one voltage regulator configured so as to provide a regulated output of the energy converter by drawing energy from the output voltage of the energy converter; and/or the at least one energy storage element.

Thanks to the voltage regulator, it is possible to provide a stable output to the load and to guarantee operation of the load even when the power provided by the first generator is not sufficient.

In some embodiments of the present invention, the first generator can include a first photovoltaic generator and the second generator can include a second photovoltaic generator.

By using photovoltaic generators as first generator and second generator, the load seen during the conversion by the first photovoltaic generator can be adapted by the energy converter so as to convert energy from the first photovoltaic generator while allowing an efficient operation of the first photovoltaic generator.

In some embodiments of the present invention, the energy converter can further include at least one third generator, wherein the at least one third generator can further include a piezoelectric generator and/or a thermoelectric generator.

Thanks to the at least one third generator, energy can be harvested from the environment in addition or in place to the energy harvested by the first photovoltaic generator. Thus the converter can harvest energy in varying environments.

In some embodiments of the present invention, the first photovoltaic generator and the second photovoltaic generator can be parts of a single photovoltaic cell, wherein the photovoltaic cell has a first output for the first photovoltaic generator and a second output for the second photovoltaic generator.

Thanks to such approach, it is possible to reduce the space occupied by having two distinct photovoltaic cells. Moreover; if the two photovoltaic generators are part of the same photovoltaic cell, it is ensured that the open circuit voltage output by the second photovoltaic generator is the same one than the first photovoltaic generator would output in the absence of a load. This can be ensured since the two photovoltaic generators are realized with the same process and are exposed to the same solar power.

In some embodiments of the present invention, the energy converter can further include at least one third generator, wherein the at least one third generator can include a piezoelectric generator and/or a thermoelectric generator.

Thanks to the at least one third generator, more power can be harvested from the environment.

The present invention can relate to an energy converter connectable to at least one first generator, for converting energy received from the at least one first generator, wherein the energy converter can further be connectable to a plurality of energy storage elements, the energy converter can include a charge sequencer configured to manage the charge/discharge order of each of the plurality of energy storage elements so as to discharge a first energy storage element being the one having a highest charge value among the plurality of energy storage elements, and/or charge a first energy storage element being the one having a lowest charge value among the plurality of energy storage elements.

Thanks to such approach, the energy converter of the present invention is capable of managing the charge/discharge cycle of a plurality of energy storage elements so as to increase the lifetime of the plurality of energy storage elements.

Furthermore, the present invention can relate to an energy conversion and storage system including an energy converter as described above; at least one energy storage element connected to the energy converter, wherein the at least one energy storage element includes at least one battery, or at least one super-capacitor.

In some embodiments of the present invention, the energy converter and the at least one energy storage element can be realized with bio-compatible materials.

In this case the converter can equip devices for surveying the environment, e.g. water quality, migration of animals, Heating Ventilating Air Conditioning (HVAC), Wireless Sensor Network (WSN), Building Automation or Home automation etc. without a risk of harming the environment if not collected after use.

Moreover, the present invention can relate to an energy conversion method, for converting energy received from the at least one first generator including a step of sensing an output value of a second generator; a step of estimating the open circuit voltage of the first generator based on the sensed output value of the second generator; and a step of converting energy received from the first generator based on the estimated open circuit voltage.

Furthermore, the present invention can relate to an energy conversion method for converting energy received from the at least one first generator, including a step of managing the charge/discharge order of each a the plurality of energy storage elements including the steps of: discharging a first energy storage element being the one having a highest charge value among the plurality of energy storage elements, and/or charging a second energy storage element being the one having a lowest charge value among the plurality of energy storage elements.

The accompanying drawings are incorporated into and form a part of a specification to illustrate several embodiments of the present invention. These drawings, together with the description, serve to explain the features, advantages and principles of the invention. The drawings are only for the purpose of illustrating preferred and alternative examples of how the invention can be made and used, and are not to be construed as limiting the invention to only the illustrated and described embodiments. Further features and advantages will become apparent from the following and more particular description of the various embodiments of the invention, as illustrated in the accompanying drawings, in which like reference refer to like elements and wherein:

Figure 1:
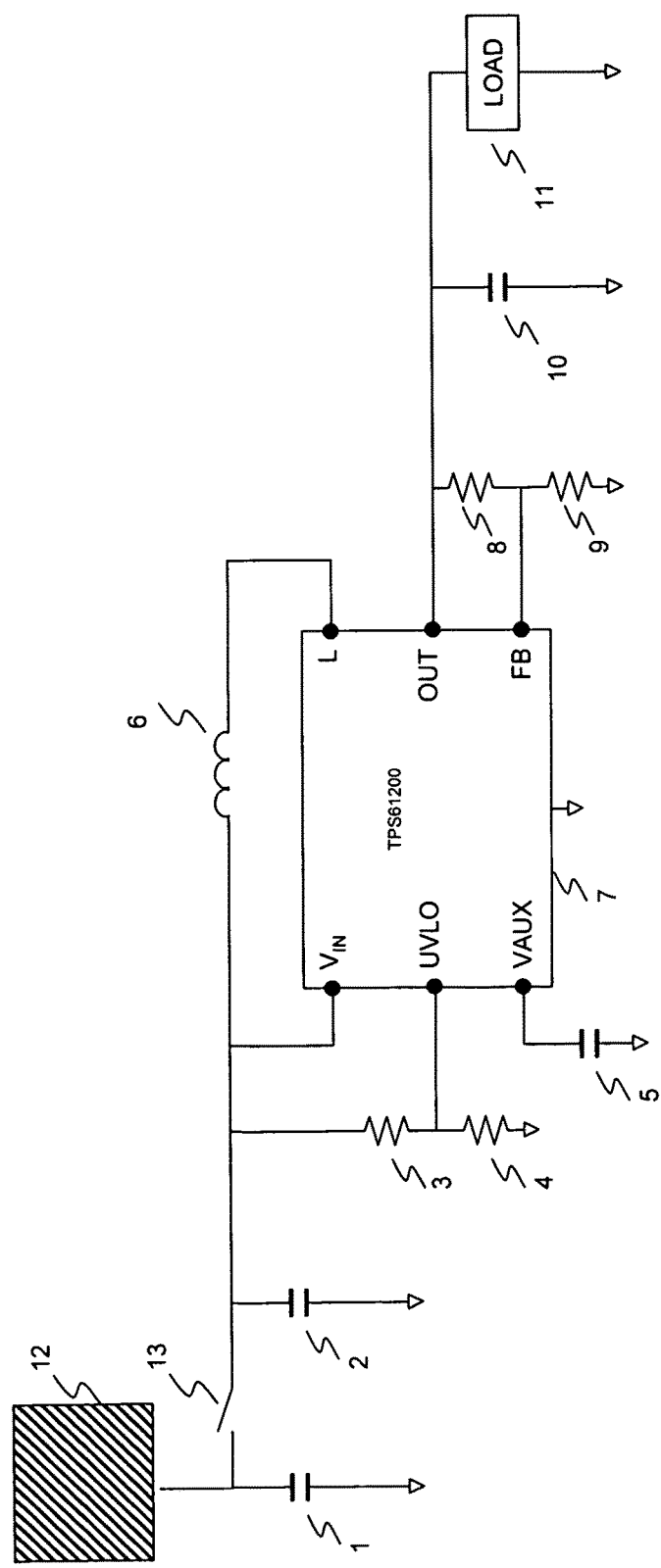
FIG. 1 illustrates a schematic example of an energy converter in accordance with an exemplary embodiment of the present invention.

FIG. 1 illustrates an energy converter using a commercially available boost converter 7 as an exemplary embodiment of the present invention. A photovoltaic cell 12 is connected to the input $V_{IN}$ of the boost converter via a switch 13. The output L is also connected to the input $V_{IN}$ of the boost converter through an inductance 6 having, for instance, a value of 2.2 uH. A load 11 is connected to the output VOUT of the boost converter. Also connected to the output of the boost converter, in parallel to the load 11, is capacitor 10 having, for instance, a value of 20 uF, and a resistance bridge composed by resistors 8 and 9 having, for instance, values of 390 kΩ and 50 kΩ, respectively. The output of the bridge is fed back to the FB port of the boost converter. Moreover, the input $V_{IN}$ of the boost converter is also connected to capacitors 1 and 2 having, for instance, values of 100 uF and 10 uF respectively, and to a resistance bridge composed by resistors 3 and 4 having, for instance, a value of 270 kΩ and 50 kΩ, respectively. The output of the resistance bridge is input to the UVLO port of the boost converter. Finally, the VAUX port of the boost converter is connected to capacitor 5.

As an exemplary boost converter 7 which can be used in such a configuration the TPS61200 from Texas Instrument could be considered. Such a boost converter has the advantage that it can work with input voltages as low as 0.5V.

However, such architecture is not suitable for exploiting the power harvested from a small photovoltaic cell.

More specifically, the architecture is conceived in order to increase the output voltage up to 4.4V—this value depends on the specific feedback circuit implemented—using a constant current of approximately 1 A. However, a small photovoltaic cell is not capable of providing such a high current. On the other hand, such a small photovoltaic generator operates in the range of a few mA. Accordingly, a capacitor of, for instance, 100 uF is needed, which is pre-charged by the photovoltaic generator up to around 3V before the boost converter turns on. This allows the high current required by the boost converter to be provided by the capacitor. Once the output voltage of the boost converter is stabilized, the boost converter moves to a power save mode if the load does not consume any current. Such behaviour can be better understood with reference to FIGS. 2A and 2B.

Figure 2A:
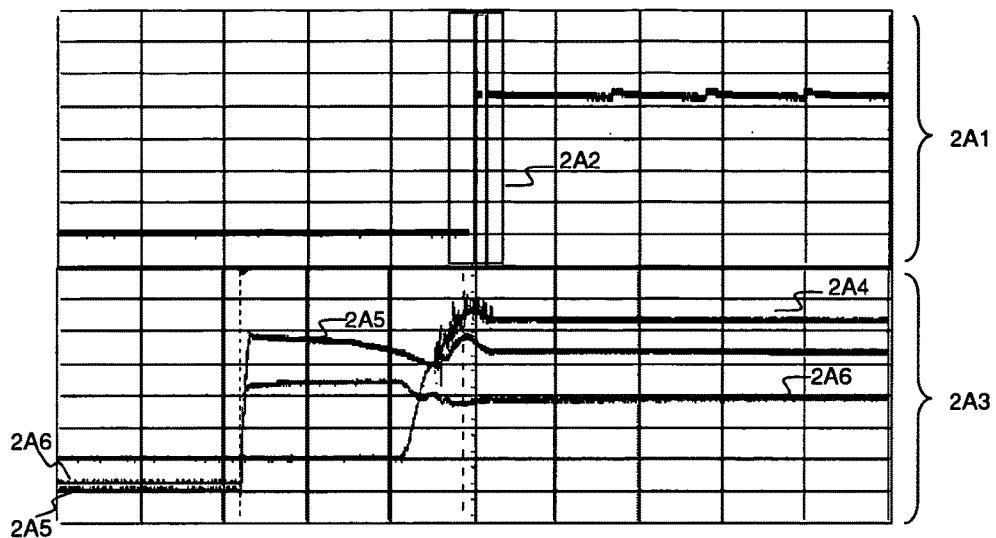
FIGS. 2A and 2B illustrate schematic waveforms of the energy converter of FIG. 1.

FIG. 2A illustrates waveforms during a power-up operation of the boost converter when the load does not consume any current. More specifically, as can be seen in FIG. 2A, two sections 2A1 and 2A3 are illustrated. The signals illustrated in section 2A3 refer to an enlarged view of the smaller part of section 2A1 indicated by region 2A2. As can be seen in section 2A3, the power-up operation causes a voltage drop of approximately 700 mV on the input voltage $V_{IN}$ 2A6. After the power-up operation, as can be seen in section 2A1, the boost converter is into a power save mode having a frequency of around 200 Hz since the load does not consume current and only the boost converter and resistance bridge consume current.

Figure 2B:
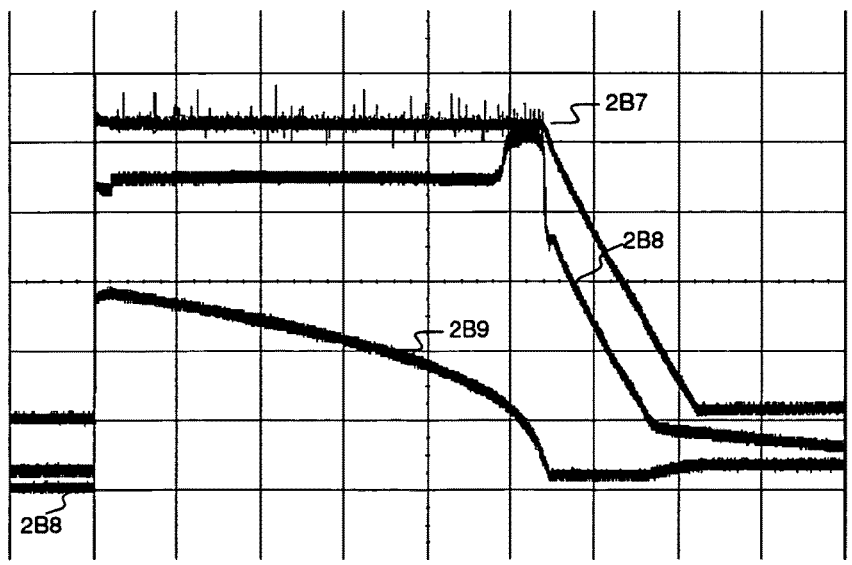

FIG. 2B, on the other hand, relates to a situation in which a current of, for instance, 1.35 mA is drawn by the load. As can be seen, the output voltage $V_{OUT}$2B7 starts at the required value. However, since the small photovoltaic cell is not capable of providing enough current to the boost converter, the input voltage $V_{IN}$2B9 slowly drops down to a value at which the boost converter automatically turns off as indicated by the drop of $V_{OUT}$2B7.

Accordingly, when the load draws a current which is too high, such architecture would not be optimal. Even if the circuit was modified so as to work in a pulsating manner, the conversion efficiency would not be optimal due to the capacitance 2 connected to the photovoltaic generator, which forces the photovoltaic generator to operate in a short circuit manner for a long period. Such a short circuit operation is not ideal since the output power of the photovoltaic generator is not maximized when operating in short circuit mode.

Figure 3:
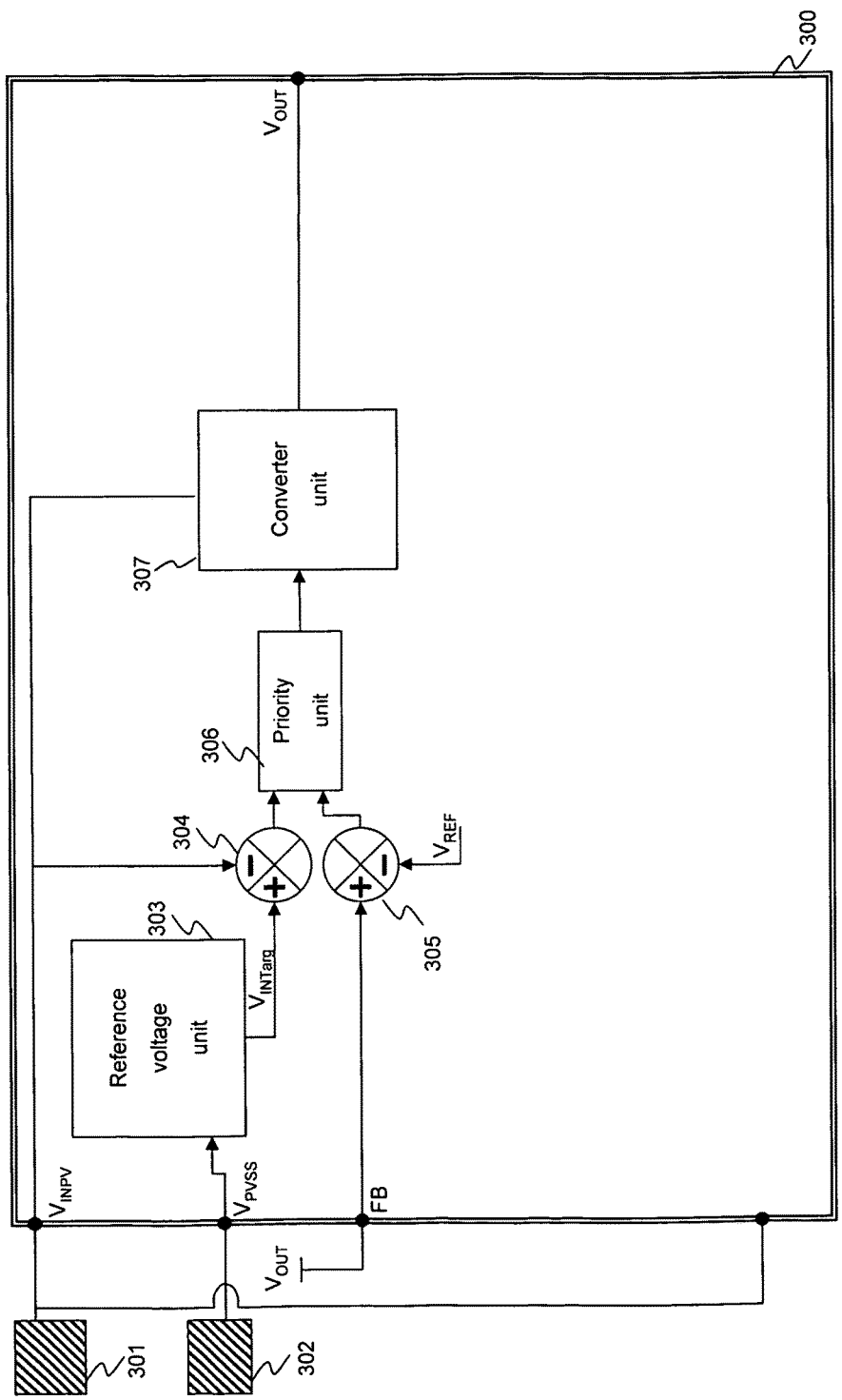
FIG. 3 illustrates a schematic example of an energy converter and an energy conversion and storage system in accordance with an embodiment of the present invention.

In order to improve this solution, an energy converter as illustrated in FIG. 3 can be realized.

As can be seen, energy converter 300 can be connected to two generators 301 and 302, for instance, two photovoltaic generators. The energy converter includes a reference voltage unit 303, two comparators 304 and 305, a priority unity 306 and a converter unit 307.

The purpose of the reference voltage unit 303 is to output a reference voltage $V_{INTarg}$ which is used as a target voltage for the input voltage $V_{INPV}$ received from the first generator 301. By target voltage it is meant a value at which it is desirable to maintain the input voltage $V_{INPV}$ with the aim of improving the efficiency of first generator 301. Reference voltage unit 303 can create reference voltage $V_{INTarg}$ by sensing an output of second generator 302, for instance the value of the open circuit voltage. Assuming that the first and second generator have a similar open circuit voltage, the determination of the open circuit voltage of the second generator readily allows the estimation of the open circuit voltage of the first generator.

Alternatively, or in addition, the second generator could have an open circuit voltage different from the open circuit voltage of the first generator, but the relationship between the two values of the open circuit voltages could be known and taken into account when estimating the open circuit voltage of the first generator based on the measured open circuit voltage of the second generator.

More generally, any characteristic of second generator 302 which can be used in order to estimate an open circuit voltage value of first generator 301 can be used, such as, for instance an output current across a predetermined resistance.

The two comparators compute the error on the input voltage $V_{INPV}$ and on the output voltage $V_{OUT}$ of the energy converter 300. Based on this information, the priority unit 306 controls a converter unit 307, so as to convert the input voltage $V_{INPV}$ to the output voltage $V_{OUT}$ by giving priority to either the stability of the input voltage $V_{INPV}$ or of the output voltage $V_{OUT}$.

Thanks to this approach, the regulation of a desired output voltage $V_{OUT}$ can be achieved by maintaining the value of the input voltage $V_{INPV}$ in a range in which efficiency of the first generator 301 is high.

FIRST EMBODIMENT

Figure 4:
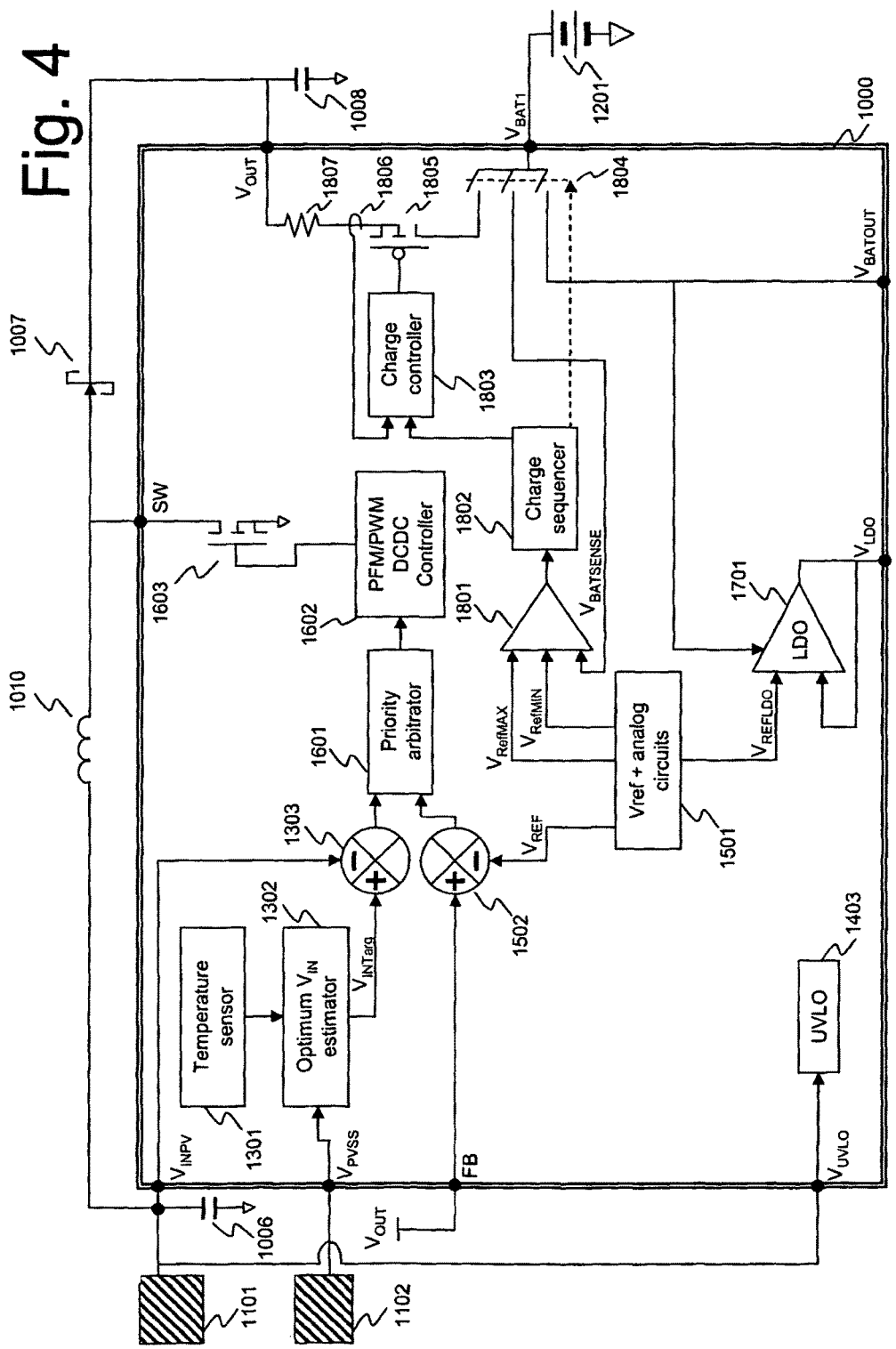
FIG. 4 illustrates a schematic example of an energy converter and an energy conversion and storage system in accordance with a first embodiment of the present invention.

FIG. 4 illustrates an energy converter 1000 in accordance with a first embodiment of the present invention. As can be seen in FIG. 4, the energy converter 1000 is connected to a first photovoltaic generator 1101 and a second photovoltaic generator 1102. The two photovoltaic generators 1101 and 1102 could be two physically distinct photovoltaic cells, or photovoltaic generator 1102 could be a small portion of a photovoltaic cell including photovoltaic generator 1101. In both cases, the energy converted by the energy converter 1000 is the one generated by photovoltaic generator 1101.

The purpose of photovoltaic generator 1102 is to provide the energy converter 1000 with the value of the open circuit voltage generated by the second photovoltaic generator 1102 as an estimation of the open circuit voltage that would be generated by first generator 1101, if no load was connected to its output.

The first photovoltaic generator 1101 is connected to the input port $V_{INPV}$ of the energy converter 1000 while the second photovoltaic generator 1102 is connected to input port $V_{PVSS}$ of the energy converter 1000.

In order to ensure that the open circuit voltage generated by the two photovoltaic generators is similar, the position and electric characteristics of photovoltaic generator 1101 and 1102 is similar. Alternatively, or in addition, if the position and/or electrical characteristics of the photovoltaic generator 1101 and 1102 are different, the relation between the open circuit voltage of the photovoltaic generator 1101 and the open circuit voltage of the photovoltaic generator 1102 could be predetermined, or measured and used when determining the open circuit voltage of the photovoltaic generator 1101 from the measured open circuit voltage of the photovoltaic generator 1102

The energy converter 1000 is capable of boosting the value of the voltage $V_{INPV}$ generated by the photovoltaic generator 1101 by means of the booster composed by inductance 1010, diode 1007, transistor 1603 and boost controller 1602. Moreover, the signal based on which the boost controller 1602 boosts the input voltage $V_{INPV}$ to obtain the output voltage $V_{OUT}$ is output from a priority arbitrator 1601.

The priority arbitrator receives two input signals representing the error on the output voltage $V_{OUT}$ and the error on the input voltage $V_{INPV}$. The error on the input voltage $V_{INPV}$ is generated by amplifier 1303. The goal of amplifier 1303 is to ensure that the input voltage $V_{INPV}$ received from photovoltaic generator 1101 is kept close to the ideal value $V_{INTarg}$, for achieving high power transfer, corresponding to the output of the optimum $V_{IN}$ estimator 1302. The error on the output voltage is generated by amplifier 1502. Amplifier 1502 generates a voltage error signal if the feedback voltage $V_{OUT}$ received through port FB differs from the reference voltage $V_{REF}$. Therefore, by a proper selection of the reference voltage $V_{REF}$, any desired output voltage $V_{OUT}$ can be obtained.

The optimum $V_{IN}$ estimator 1302 has two inputs connected to the output of a temperature sensor and to port $V_{PVSS}$, connected in turn to the second photovoltaic generator 1102. The optimum $V_{IN}$ estimator 1302 senses the open voltage value generated by the second photovoltaic generator 1102 thereby acting as a sensing unit. Moreover, the optimum $V_{IN}$ estimator 1302 computes an optimized voltage value $V_{INTarg}$, which corresponds to a range of 5% to 35%, preferably 15% to 20%, less than the open voltage value generated by the second photovoltaic generator 1102. In addition, in the computation of the optimized voltage $V_{INTarg}$, the temperature measured by temperature sensor 1301 can also be taken into account.

More specifically, the efficiency, and therefore the output power of a photovoltaic generator, is constant until 15 to 25° C. Above this value, it decreases, with the increase of the temperature, by around 0.4% per degree Celsius of increase.

More specifically, for example, a potential implementation for computing $V_{INTarg}$ by the optimum $V_{IN}$ estimator 1302 could be the following. Until the temperature measured by the temperature sensor 1301 is below a predefined Threshold temperature, $T_{TH}$, between 0 to 30° C., preferably between 15 to 25° C., a correction factor alpha in the range of 5% to 35%, preferably 15-20%, is applied to the open circuit voltage $V_{PVSS}$ so that $$V_{INTarg} = V_{PVSS}*(1-\text{alpha})$$

When the temperature measured by the temperature sensor 1301 is above the predefined Threshold temperature $T_{TH}$, a correction factor beta, in the range of 0.1% to 1%, preferably 0.4% is also applied so that $$V_{INTarg} = V_{PVSS}*(1-\text{alpha}-\text{beta}*(\text{temp}-T_{TH}))$$

It is to be noted that the temperature sensor 1301 is optional and the computation of $V_{INTarg}$ could be based entirely on the open circuit voltage received from the second photovoltaic generator 1102, that is, the correction factor beta could be considered equal to 0. Alternatively, or in addition, the temperature measurement can be realized with an external temp sensor.

Still alternatively, the two generators 1101 and 1102 could have a predetermined different behaviour with respect to the temperature and the temperature could be determined by measuring some output characteristic of the two generators. For instance, the open circuit voltage of both generators could be measured, and from those two values the temperature could be derived.

The priority arbitrator 1601 operates so as to ensure that the output voltage $V_{OUT}$ corresponds to the desired reference voltage $V_{REF}$ and to ensure that the input voltage $V_{INPV}$ remains within the range for optimal power generation for the photovoltaic generator. Priority is given to the output voltage $V_{OUT}$ regulation when enough power is produced by the photovoltaic generator 1101. On the other hand, priority is given to the regulation of the input voltage $V_{INPV}$ whenever the power available is less than the power required by the load. Whether enough power is produced by the photovoltaic generator, is judged based on whether the error signal of the input voltage $V_{INPV}$ can be maintained below a certain threshold. If not enough power can be generated, the error on the input voltage $V_{INPV}$ will inevitably tend to increase, thereby indicating that not enough power is available for maintaining the output voltage $V_{OUT}$ to the desired level $V_{REF}$.

The energy converter 1000 is further connected to a battery 1201 via a port $V_{BAT1}$ so as to realize an energy conversion and storage system in accordance with the present invention. In this case, the energy conversion and storage system is operating with a single battery. However, the present invention is not limited to this and the energy conversion and storage system can be realized with more than one battery and/or with super-capacitors as will be described later.

Moreover, the energy converter 1000 is provided with an output port $V_{LDO}$ connected to the output of an LDO 1701. A potential load could be connected to the port $V_{LDO}$. Such a potential load can be therefore driven by the power generated by the first photovoltaic generator 1101 and converted by the boost converter and/or by the power retrieved from the battery 1201. In the case where the power generated by the first photovoltaic generator 1101 is not sufficient, additional power could be obtained by discharging the battery 1201. On the other hand, if the power generated by the first photovoltaic generator 1101 is higher than the one required by the load, the unused power could be diverted in order to recharge the battery. Accordingly, in the case where no load is connected to the energy converter, the entire power generated by the first photovoltaic generator 1101 could be used to recharge battery 1201. At the same time, if no power is generated by the first photovoltaic generator 1101, a potential load could nevertheless be driven by discharging battery 1202. Such a configuration therefore provides the energy converter 1000 of the present invention with a vast range of operating modes and ensures that the load connected to the port $V_{LDO}$ is always operated when required.

In addition to the components mentioned above, the energy converter 1000 of the present invention contains an under voltage lock out or UVLO 1403 connected to the output of the first photovoltaic generator 1101 through port $V_{UVLO}$. The purpose of the UVLO 1403 is to generate a signal activating the energy converter 1000 once the voltage $V_{UVLO}$ reaches a predetermined reference value. The energy converter will then remain active until the voltage $V_{UVLO}$ moves below the predetermined reference voltage. The UVLO component 1403 is provided with a certain level of hysteresis. This allows the energy converter 1000 to operate in a reliable manner even in the presence of oscillations in the $V_{UVLO}$ voltage caused, for instance, by the power-up operation of the boost converter.

Moreover, energy converter 1000 includes a VREF generator, together with other analog circuits, represented by block 1501. The output $V_{REF}$ of block 1051 is inputted to amplifier 1502. The output $V_{REFLDO}$ of block 1501 is inputted to LDO 1701. The purpose of voltage $V_{REFLDO}$ is to drive the value of the output voltage $V_{LDO}$ of the LDO 1701.

Moreover, block 1501 generates output $V_{RefMAX}$ and $V_{RefMIN}$ which are input to SWAP comparators 1801. SWAP comparators 1801 further receive as an input the voltage $V_{BATSENSE}$. Based on these three inputs, the SWAP comparators 1801 are capable of managing the charge/discharge cycles of the batteries. At least two comparators are used. The first one manages the battery during the charge phase and switches whenever the voltage $V_{BATSENSE}$ at the terminals of the battery 1201 has reached a high voltage $V_{RefMAX}$ indicating that the battery is charged. The second SWAP comparator manages the battery when power is discharged from the battery in order to drive the load and switches whenever the voltage $V_{BATSENSE}$ at the terminals of the battery 1201 reaches a low value $V_{RefMIN}$ indicating that the battery has been discharged. The output of the SWAP comparators is input into the charge sequencer 1802.

The charge sequencer 1802 is used to memorize the charge state of the battery 1201 and in order to manage the power flow between the power generated by the first photovoltaic generator 1101 and converted by the boost converter, the power stored in the battery 1201 and the power required by the load connected to the node $V_{LDO}$. The charge sequencer 1802 is therefore connected to switches 1804 in order to connect the LDO 1701, the battery 1201 and the first photovoltaic generator 1101 in the manner required by an operational state of the energy converter 1000.

More specifically, battery 1201 can be realized with different technologies. Each technology implies that a certain charge/discharge threshold should be respected in order to increase the battery's life.

For instance, film batteries might have a maximum discharge threshold $V_{RefMIN}$ of 30%, meaning that they should not be depleted to more than 30% of their nominal capacity. Similarly, alkaline batteries might have a maximum discharge threshold of 50%. Other batteries might have different values.

Symmetrically, film batteries might have a minimum charge threshold $V_{RefMAX}$ of 90%, preferably 100%, meaning that they should be recharged to at least 90% of their nominal capacity, or even to their full nominal capacity, before being discharged. A similar value could be used for alkaline batteries. Other batteries might have different values.

The value of the maximum discharge threshold and minimum charge threshold of battery 1201 could be saved within charge sequencer 1802. Based on those values, an improved battery cycle could be obtained.

The charge sequencer 1802 therefore controls switches 1804 in order to connect the LDO 1701, the battery 1201 and the first photovoltaic generator 1101 so as to increase battery life while guaranteeing operation of the load. The details on how this is achieved will be described later.

Energy converter 1000 further incorporates charge controller 1803. The purpose of charge controller 1803 is to act as a linear charger or as a bypass charger. The linear charger mode is employed when charging battery 1201 with a current having a constant value, whenever the input power generated by first photovoltaic generator 1101 is not sufficient for providing battery 1201 with all the current that battery 1201 can sink. The bypass mode on the other hand, is employed when there is enough power to let the battery sink all the current it can. Charge controller 1803 is turned on and off by charge sequencer 1802 whenever charge sequencer 1802 determines that the battery 1201 has to be charged or not. Moreover, charge controller 1803 is controlled by an output (not shown in the Figures) of priority arbitrator 1601 which decides whether the charge controller 1803 should be operated in a linear mode or in a bypass mode.

The charge controller 1803 can be therefore operated so as to let all current flow through transistor 1805 (bypass mode) or by controlling the amount of current flowing to battery 1201 through the application of an appropriate control voltage on the gate of transistor 1805 (linear mode). Charge controller 1803 receives a feedback voltage, indicating the current flowing through transistor 1805, via a current detector 1806.

Additionally, the energy converter 1000 comprises a node $V_{BATOUT}$ which can be used in order to gain direct access to the voltage of the battery 1201. Additionally, a resistance 1807 can be connected between the node $V_{OUT}$ and the transistor 1805. Moreover, as can be seen in FIG. 4, capacitors 1006 and 1008, in the range of 1 uF to 10 uF could optionally be connected to the input node $V_{impv}$ and the output node $V_{out}$. Capacitor 1006 can optionally be used to provide the high current needed at startup of the energy converter, while capacitor 1008, in the range of 50 nF to 150 nF, preferably 100 nF, can be optionally used to smooth the output of the boost converter.

First Alternative to the First Embodiment

Figure 6:
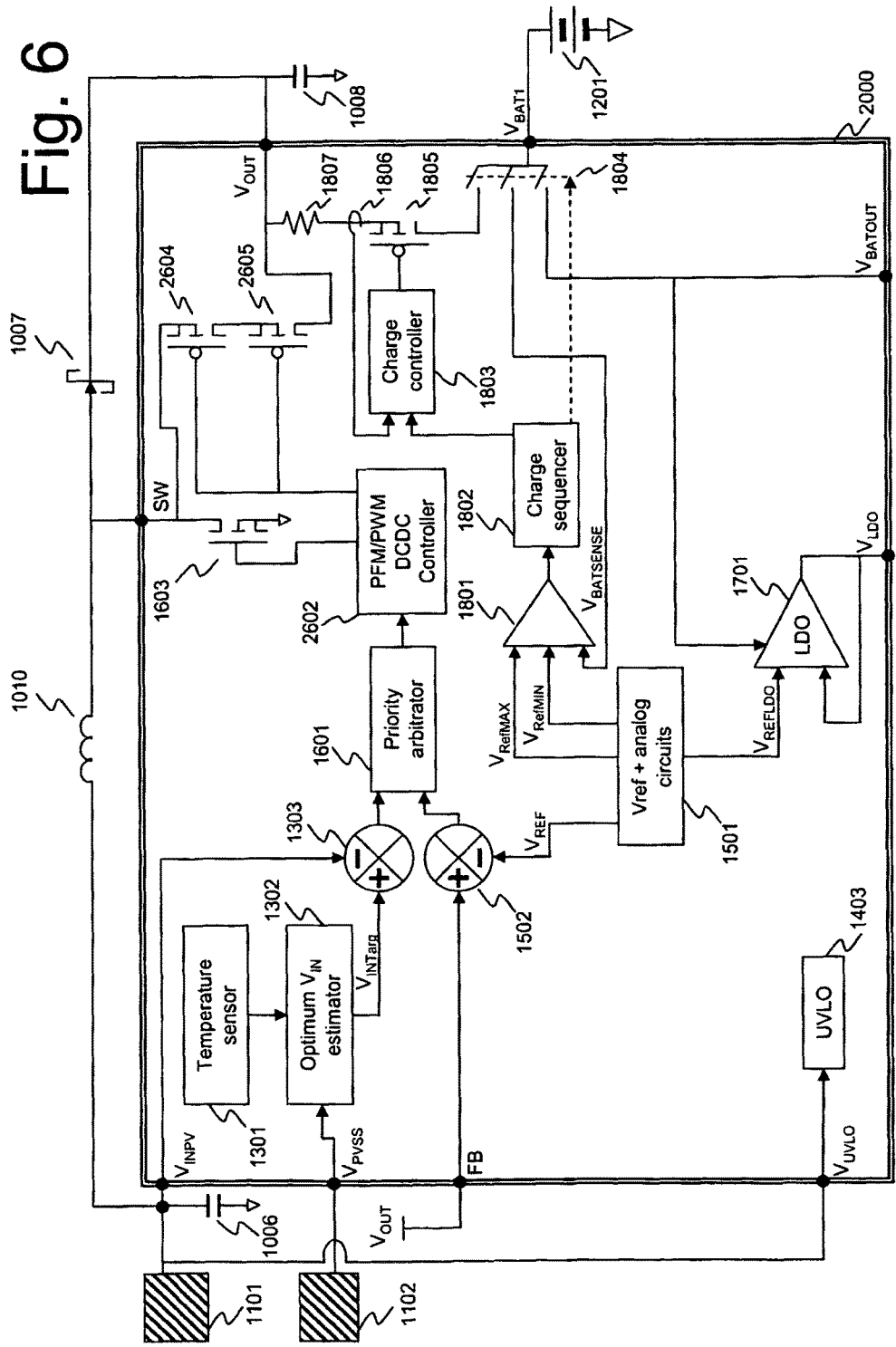
FIG. 6 illustrates a schematic example of an energy converter and an energy conversion and storage system in accordance with a first variation of the first embodiment of the present invention.

FIG. 6 represents an alternative implementation of the first embodiment illustrated in FIG. 4.

As can be see in FIG. 6, the energy converter 2000 differs from energy converter 1000 due to the presence of transistors 2604 and 2605 controlled by a boost controller 2602. The purpose of those two transistors is to act as synchronized output switch in order to reduce the series losses of the diode 1007.

Second Alternative to First Embodiment

Figure 7:
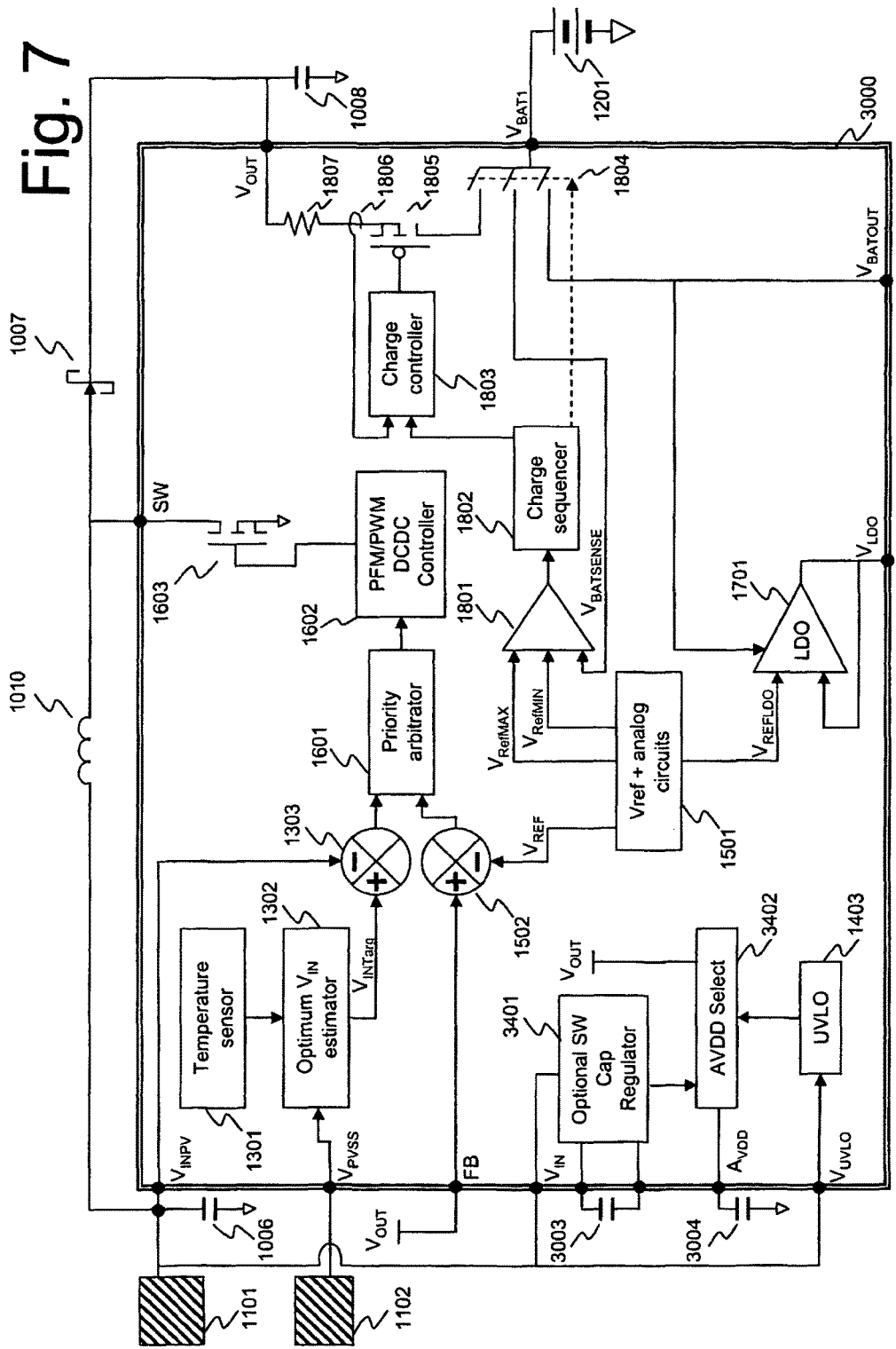
FIG. 7 illustrates a schematic example of an energy converter and an energy conversion and storage system in accordance with a second variation of the first embodiment of the present invention.

FIG. 7 illustrates a second alternative to the first embodiment of FIG. 4.

As can be seen in FIG. 7, the energy converter 3000 differs from the energy converter 1000 due to the presence of optional switch SW cap regulator 3401, analog power supply AVDD, select block 3402 and capacitors 3003 and 3004.

The purpose of the AVDD select block 3402 of the energy converter 3000 is to select, on real time, the voltage source used to power the analog functions of the energy converter 3000. More specifically, the source can be selected between $V_{OUT}$ and $V_{IN}$.

As can be seen, the output of the AVDD select 3402 is connected to a port $A_{VDD}$ which is in turn connected to capacitor 3004. The purpose of capacitor 3004 is to ensure that the power supply of the analog components, corresponding to the $A_{VDD}$ signal remains stable.

The purpose of the optional SW cap regulator 3401 is to create a high voltage from the low voltage $V_{IN}$. More specifically, the regulator 3401, by virtue of its connection to capacitor 3003 is capable of doubling the voltage $V_{IN}$ and regulate it so as to generate a high voltage value of, for instance, 3.3V, or a required high voltage value so as to maintain the operation of the analog functions of the energy converter 3000.

Third Alternative to the First Embodiment

Figure 8:
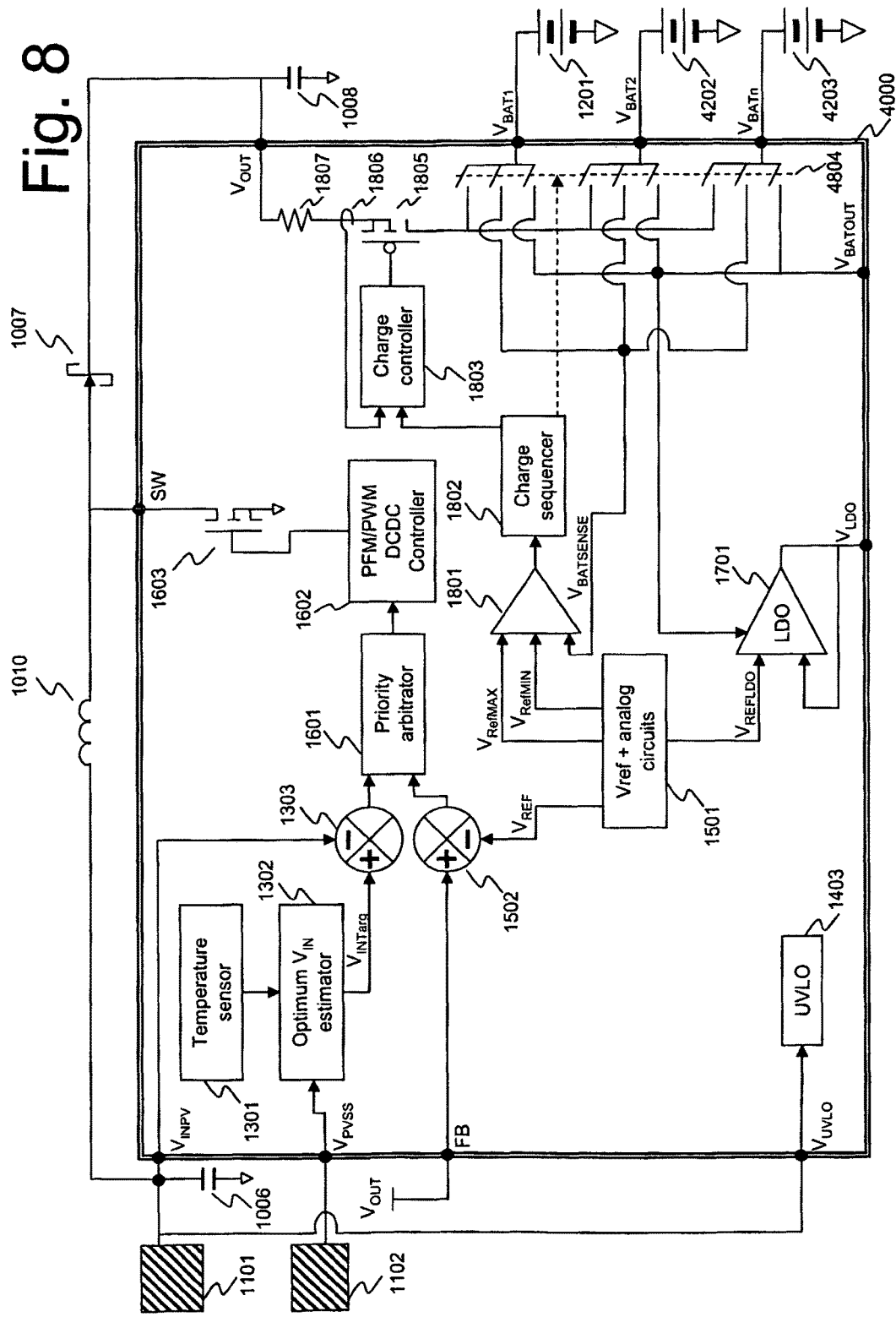
FIG. 8 illustrates a schematic example of an energy converter and an energy conversion and storage system in accordance with a third variation of the first embodiment of the present invention.

FIG. 8 illustrates a third alternative to the first embodiment of FIG. 4.

As can be seen in FIG. 8, energy converter 4000 differs from energy converter 1000 due to the presence of multiple batteries 4202 and 4203. Although two additional batteries are present in energy converter 4000, any number of additional batteries from one up to for instance 5, 10, 20, or even higher, can be used. The presence of multiple batteries provides the advantage that more energy can be stored, higher bursts of energy can be provided if necessary, as well as providing a redundant design which ensures operation even in the case of failure of one or more batteries.

Moreover, the presence of multiple batteries allows the charge/discharge cycle of each battery to be managed more efficiently, thereby resulting in an increased lifetime as will be explained later.

The presence of plural batteries 1201, 4202 and 4203 requires switches 1804 of the energy converter 1000 to be replaced by switches 4804 of energy converter 4000. Switches 4804 may operate in a parallel manner so as to connect all the batteries in the same way. That is to say, switches 4804 might connect batteries 1201, 4202 and 4203 to the same signal, the signal being $V_{BATOUT}$, and/or $V_{BATSENSE}$, and/or $V_{OUT}$. On the other hand, switches 4804 can be operated so as to connect each single battery in a different way. For instance, battery 4203 could be connected to the signal $V_{BATOUT}$ in order to power the load through the LDO 1701. At the same time, battery 4202 could be connected to signals $V_{BATSENSE}$ and $V_{OUT}$ so as to be charged via the power generated by the first photovoltaic generator 1101. At the same time, battery 1201 might also be connected in a manner so as to be charged, or might be disconnected from energy converter 4000, or it might be connected to the signal $V_{OUT}$ so as to help in charging battery 4202, or it maybe connected to the signal $V_{BATOUT}$ in order to help battery 4203 in driving the load through the LDO of 1701. More generally, switches 4804 might be configured so as to control each of the connection of the plurality of batteries 1201, 4202 and 4203 in an independent manner according to the logic dictated by the charge sequencer 1802.

Fourth Alternative to the First Embodiment

Figure 10:
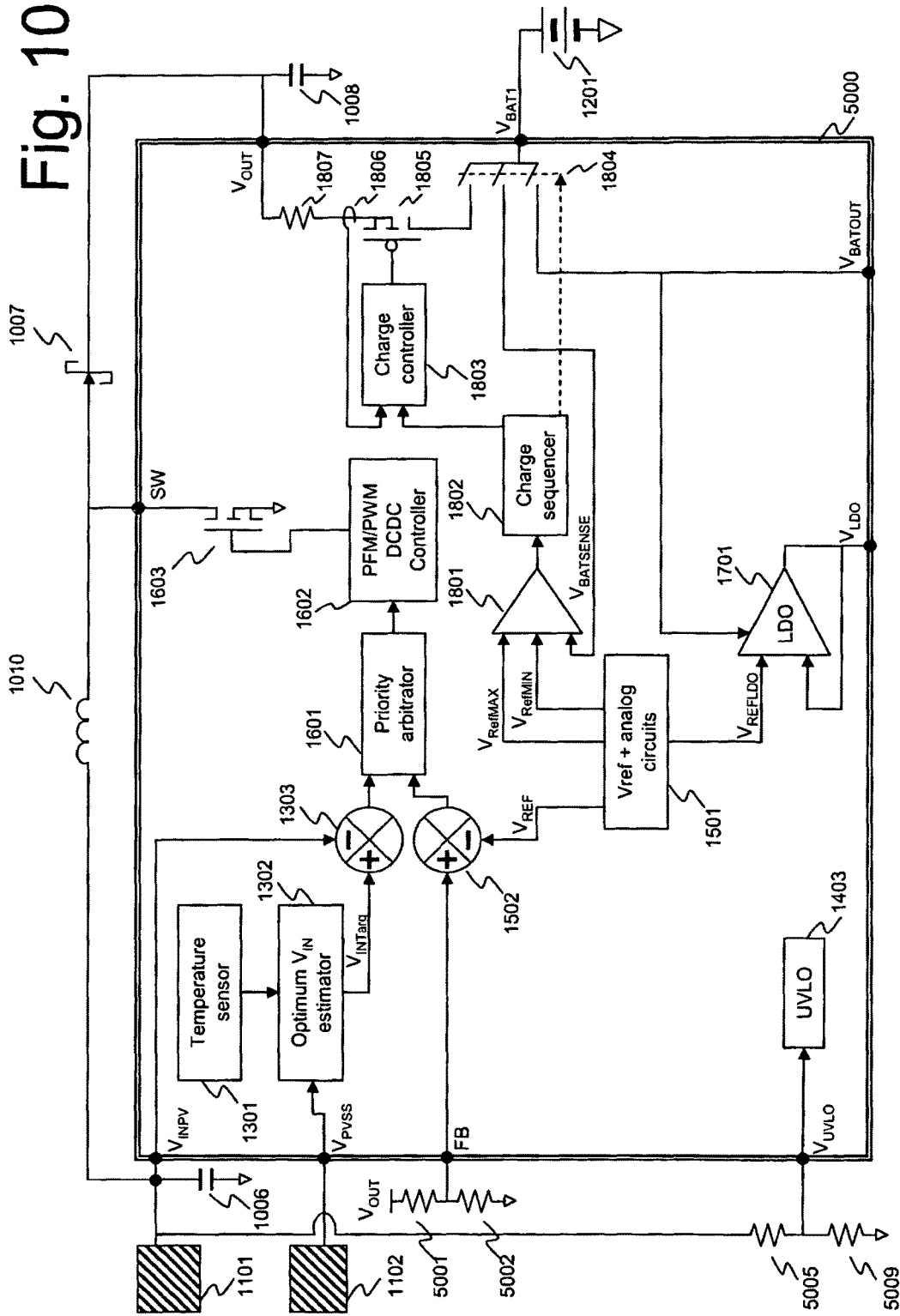
FIG. 10 illustrates a schematic example of an energy converter and an energy conversion and storage system in accordance with a fourth variation of the first embodiment of the present invention.

FIG. 10 illustrates a fourth alternative to the first embodiment represented by FIG. 4.

As can be seen, energy converter 5000 of the fourth alternative differs from energy converter 1000 of the first embodiment due to the presence of resistors 5001 and 5002 realizing a resistance bridge between the signal $V_{OUT}$ and the node FB and due to the presence of resistors 5005 and 5009 realizing a resistance bridge between the signal $V_{INPV}$ and the node $V_{UVLO}$.

Such resistance bridges can be sized by the designer of energy converter 5000 so as to provide the appropriate ratio for the feedback signal FB inputted to amplifier 1502 and for the signal driving the UVLO 1403.

Figure 11:
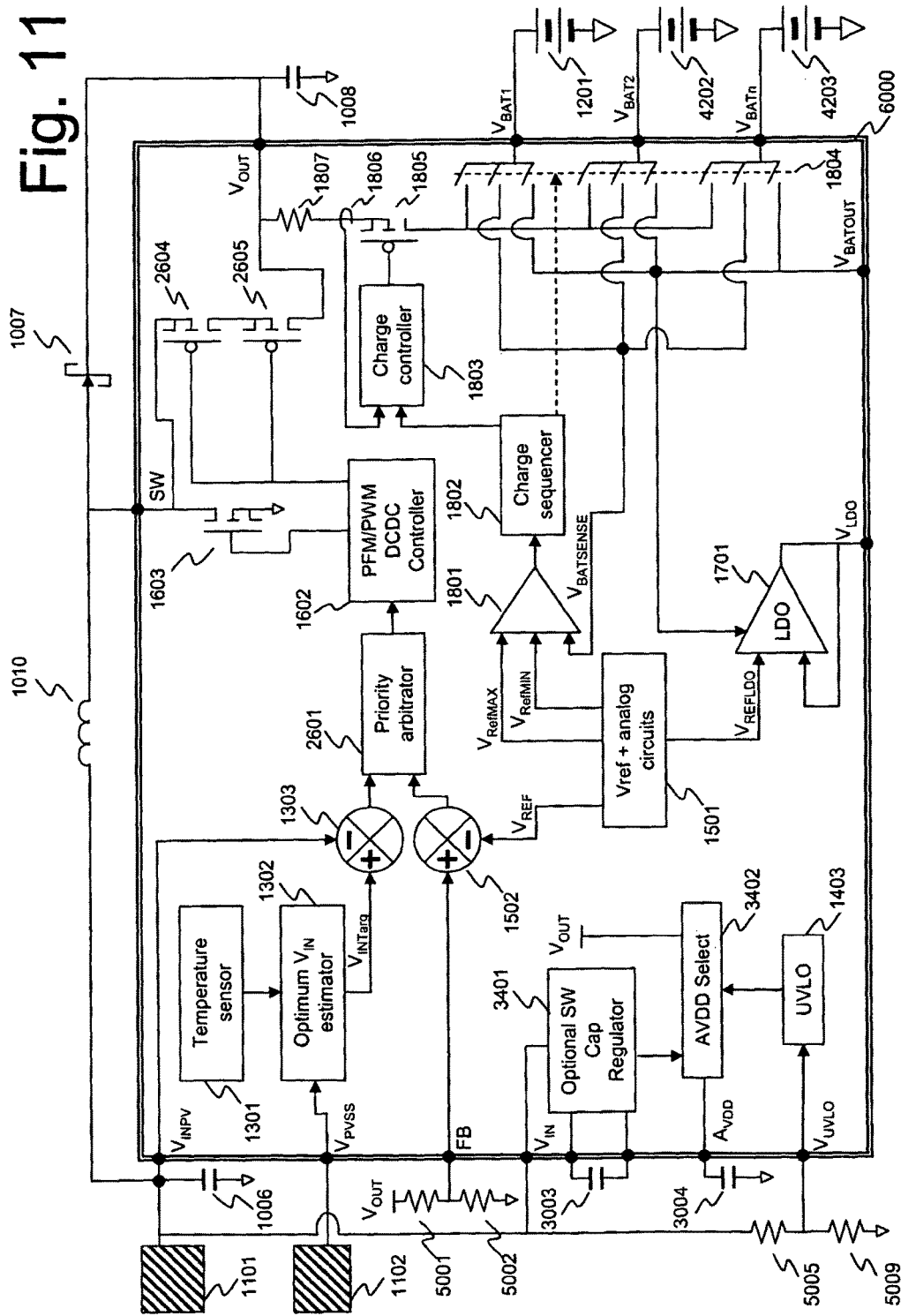
FIG. 11 illustrates a schematic example of an energy converter and an energy conversion and storage system incorporating the first, second, third and fourth variation of the first embodiment of the present invention.

Finally, FIG. 11 illustrates an embodiment of an energy converter 6000 including all the features of the first embodiment, and the first, second, third and fourth variation of the first embodiment. It is to be understood that the first, second, third and fourth variations of the first embodiment can be applied to the first embodiment in any combination. For instance, a designer might decide to apply only the first variation to the first embodiment. Alternatively, a designer might decide to apply the first and fourth variation to the first embodiment at the same time. Still alternatively, the first embodiment might be employed without any of the variations. More generally speaking, any combination of energy converters 1000, 2000, 3000, 4000, and 5000 can be implemented.

Operation of the First Embodiment

Figure 5:
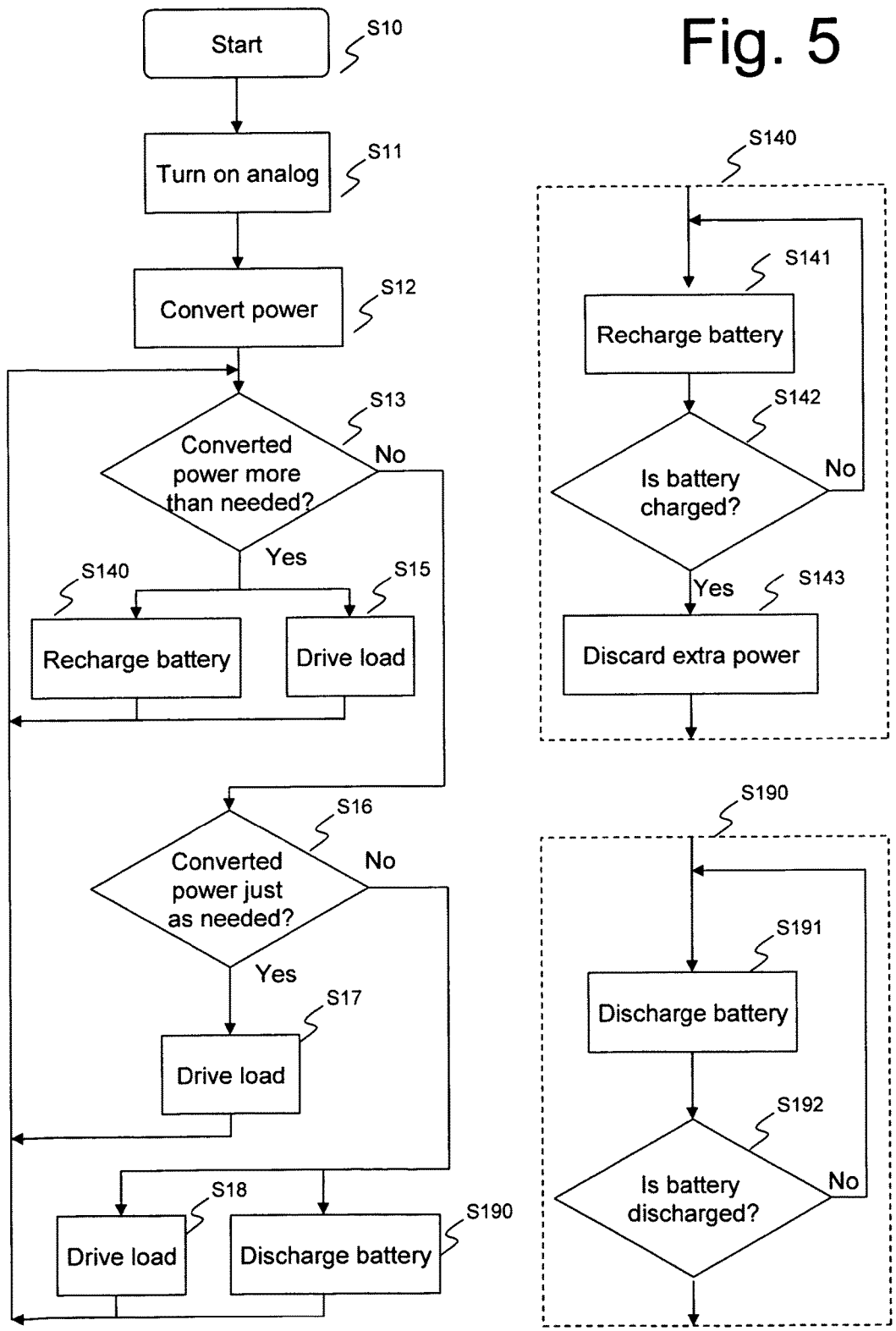
FIG. 5 illustrates a schematic operation of the first embodiment illustrated in FIG. 4.

FIG. 5 represents a schematic operation of the first embodiment illustrated in FIG. 4.

Power-Up

As can be seen in FIG. 5, energy converter 1000 is started at step S10. The starting procedure may consist in the switching of a ON/OFF button. Alternatively, or in addition, it might be automatically controlled by the UVLO 1403 reaching a predetermined reference value.

More specifically, when irradiated by light, the first photovoltaic generator 1101 charges the capacitance 1006. At this time, the capacitance 1006 is seen by the photovoltaic cell 1101 as a short circuit. Accordingly, the photovoltaic cell 1101 will charge the capacitance 1006 which its short circuit current, the value of which depends on the incident light power. Once the voltage on the node $V_{UVLO}$ reaches the value required for triggering the UVLO 1403, the output of the UVLO 1403 will switch to turn on the energy converter. For instance, for the energy converter 5000 and 6000, due to the presence of the resistance bridge realized by resistances 5005 and 5009, the time necessary for the UVLO 1403 to reach the triggering value $V_{UVLO}$ will be give by the following equation (Eq1)

$$T_{UVLO\_OK}=C_{IN}(V_{UVLO}\times(R_2+R_1)/R_1)/I_{INPV} \quad (Eq1)$$

Where $R_1$ represents resistance 5009, $R_2$ represent resistance 5005, $V_{UVLO}$ represents the trigger voltage of the UVLO 1403, $C_{IN}$ represents input capacitance 1006, $I_{INPV}$ represents the short circuit current provided by first photo voltaic cell 1101 and $T_{UVLO\_OK}$ represents the time needed for the UVLO for switching.

In a step S11, the analog circuits are powered ON, so as to provide elements within energy converter 1000 with the required analog signals.

Once the UVLO 1403 switches, it turns on the analog functions 1501 for the operation of the energy converter. The design of the analog functions is carried out so that the current consumed by those functions does not exceed a predetermined level of, for instance, 10 uA to 20 uA so as to ensure that the load represented by the analog functions does not lower the input voltage $V_{INPV}$ so as to trigger again the UVLO and to turn off the energy converter.

Once the analog functions are active and stable, a logic signal issued from a RC timer (not shown in the Figures) or a signal indicating that the analog functions are active and stabilized (not shown in the Figures) is used in order to activate the boost converter so as to boost the input voltage $V_{INPV}$ to obtain the output voltage $V_{OUT}$.

The ramping up of the output voltage $V_{OUT}$ is done so as to limit the average current drawn from the capacitance 1006. This is carried out so as to avoid taking more current from capacitance 1006 than the one that can be provided by the photovoltaic generator 1101 and/or by the capacitance 1006. The boost converter will then be operated in an impulse manner while monitoring the input voltage $V_{INPV}$ and ensuring that the input voltage $V_{INPV}$ remains close to the optimum voltage value $V_{INTarg}$ generated by the optimum $V_{IN}$ estimator 1302. This allows to charge the output capacitance 1008 with a limited current while assuring that the voltage $V_{INPV}$ is kept at a value which provides the best possible power transfer from first photovoltaic cell 1101.

Management of the Analog Power Supply $A_{VDD}$

The energy converter of the first embodiment can be implemented with a photovoltaic generator 1101 capable of providing a nominal voltage around 2V. In this case, the generation of a voltage $A_{VDD}$ used to power the analog functions of the energy converter, having a value higher than the 2V generated by the photovoltaic generator 1101, can be implemented. A voltage value higher than 2V may allow a better linearity of the analog functions, a better PSRR (Power Supply Rejection Ratio) and better frequency performances. Moreover, such a higher voltage can be obtained from different sources within the energy converter, for instance, the output voltage $V_{OUT}$ or the voltage stored in battery 1201.

At the same time, a small regulator 3401 capable of doubling the input voltage $V_{INPV}$ and to regulate it to a value of, for instance, 3.3V, can be included in the energy converter such as, for instance, in energy converter 3000.

Open Circuit Regulation

In a step S12, the priority arbitrator 1601 starts operating so as to convert power received from the first photovoltaic generator 1101 to the output node $V_{out}$.

The output voltage $V_{OUT}$ reaches a stable value as a function of the voltage $V_{REF}$. For instance, in the case of energy converter 6000 of FIG. 11, the output voltage $V_{OUT}$ is given by the following equation (2)

$$V_{OUT}=V_{FB}\times((R_3+R_4)/R_3) \quad (Eq2)$$

Where $V_{FB}$ represents the voltage at the node FB, $R_3$ represents resistance 5002, and $R_4$ represent resistance 5001. For instance, if the battery 1201 has a maximum operating voltage of 4.1V, the choice of the voltage $V_{REF}$ is done so as to ensure that the voltage $V_{OUT}$ will not exceed the maximum rated voltage of 4.1 volt.

The boost converter can therefore drive the current pulses in a PFM (Pulse Frequency Modulation) mode, for instance, and let the voltage $V_{INPV}$ diverge so as to become equal to the open circuit voltage.

In a step S13, the priority arbitrator evaluates weather the power being converted is enough to supply the load connected to the node $V_{LDO}$. The evaluation can be performed thanks to the inputs provided by comparators 1502 and 1303.

If the result of the determination as step S13 is that the power being converted is not more than the one needed by the load connected to the node $V_{LDO}$, in a step S16, the priority arbitrator evaluates weather the power being converted is just enough to supply the load connected to the node $V_{LDO}$. The evaluation can be performed thanks to the inputs provided by comparators 1502 and 1303.

If the result of the determination as step S16 is that the power being converted is just enough to supply the load connected to the node $V_{LDO}$, the load is driven at a step S17.

Battery Charge

If the result of the determination as step S13 is that the power being converted is more than the one needed by the load connected to the node $V_{LDO}$, the load is driven at a step S15. At the same time, recharge of battery 1201 is carried out at a step S140.

Steps S15 and S140 are executed by a proper connection of switches 1804 by means of charge sequencer 1802. More specifically, in order to drive the load and recharge the battery, node $V_{OUT}$ is connected to node $V_{BATOUT}$ and node $V_{BAT1}$.

The execution of steps S15 and S140 is carried out until it is detected, by means of comparators 1502 and 1303 and priority arbitrator 1601, that the amount of power being converted has changed, and/or until it is detected that the amount of power used by the load has changed.

The battery recharge step S140 is composed by steps S141, S142 and S143. Step S141 consists in recharging the battery, by connecting at least $V_{OUT}$ to $V_{BAT1}$. At step S142 it is judged, by means of SWAP comparators 1801, whether the battery has been charged to a value corresponding to the minimum charge threshold of battery 1201 saved within charge sequencer 1802. If it is judged at step S142 that the battery is charged to at least the minimum charge threshold value, $V_{BATOUT}$ is disconnected from $V_{OUT}$ and the priority arbitrator 1601 is operated so as to convert the power to drive the load. This effectively results in discarding the amount power which could be converted but which is not needed by the load.

More specifically, once the output voltage $V_{OUT}$ has stabilized, and before charging the batteries, the charging state of the batteries can be determined. In the case of multiple batteries 1201, 4202 and 4203, the charging state of each battery can be determined. This allows not only the charging state of the batteries to be known, but also to detect potential issues with the batteries, for instance, when a short circuit or an open circuit is detected.

The charge sequencer 1802 is configured to store the information relating to the quality of the batteries (charge level and/or defect) and so as to manage the charge and discharge of the batteries during the operation of the energy converter in an appropriate manner, based on said stored information. For instance, if a battery has been recognized to be defective during a previous check, the charge sequencer can decide not to check the battery again. Moreover, the charge sequencer can decide not to charge and/or discharge the battery.

When using thin film batteries available on the market, a constant voltage charging method is suggested. However, the application of a constant voltage of, for instance, 4.1V allows the injection in the battery of a current in the range of 10 mA to 30 mA, in the case of charging at 30° C. for a battery of 1 mAH. At the same time, such a current may not be available from the output of photovoltaic generator 1101. In this case, the charging of the battery can be done at a constant power instead of a constant voltage. The priority arbitrator 1601 is therefore configured so as to detect the divergence of the output voltage $V_{OUT}$ and start a functioning mode in which the charge controller 1803 is employed in linear mode. The priority arbitrator 1601 is further configured so as to operate the boost converter in a manner to regulate the input voltage $V_{INPV}$ by transferring current pulses from capacitance 1006 to capacitance 1008.

Different options exist for the generation of the current pulses. For instance, the pulses can be dynamically spaced in order to regulate the input voltage.

Battery charge for the third alternative to the first embodiment

Figure 9:
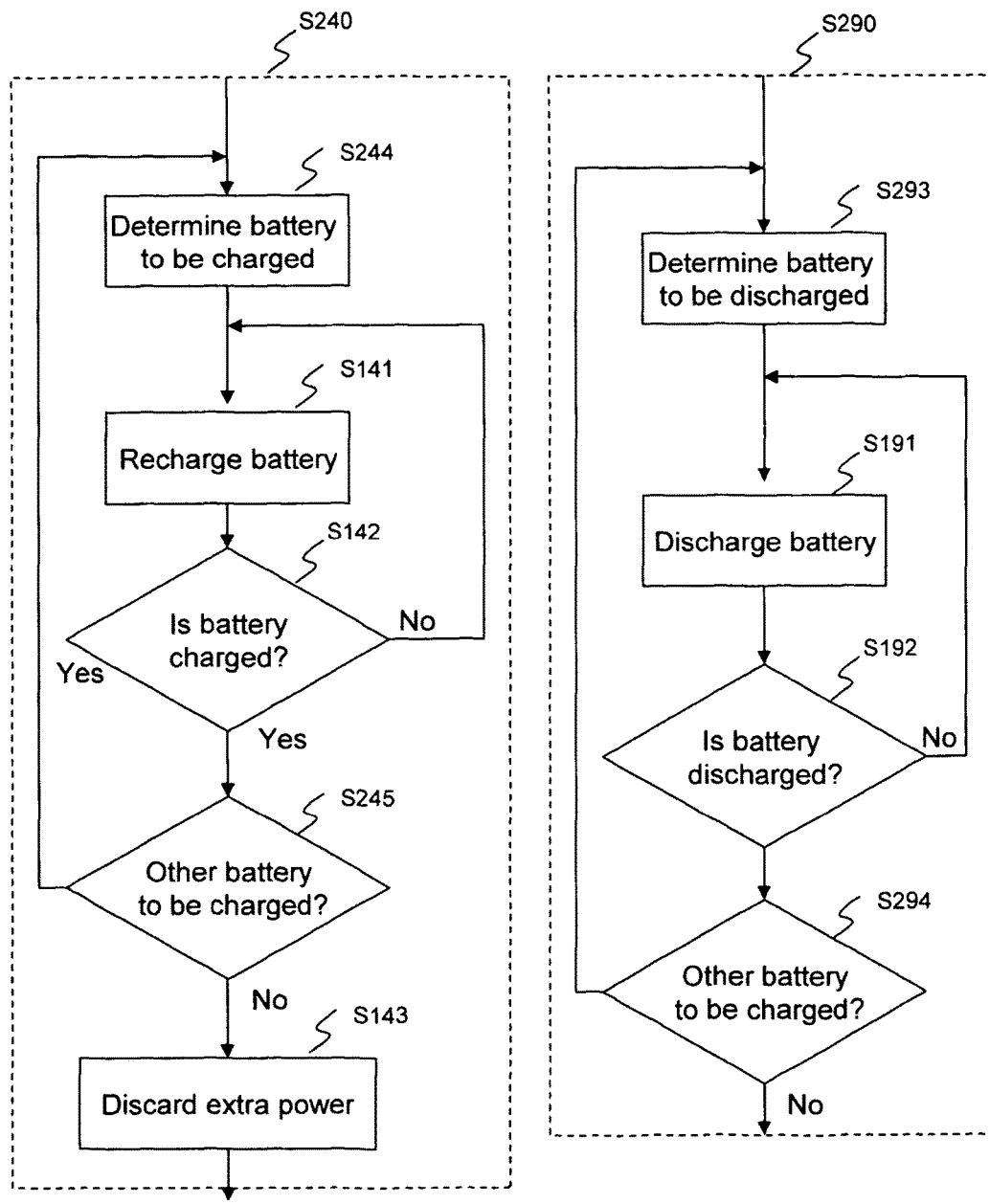
FIG. 9 illustrates a schematic operation of the third variation of the first embodiment, illustrated in FIG. 8.

The charging operation of the third alternative to the first embodiment, including a plurality of batteries 1201, 4202 and 4203, is illustrated in FIG. 9.

The operation of FIG. 9 differs from the operation of FIG. 5 due to the presence of more than one battery. More specifically, steps S140 and S190 of FIG. 5 are replaced by steps S240 and S290 of FIG. 9 respectively.

Charging step S240 includes step S244, step S141, step S142, step S245 and step S143. Step S141, step S142 and step S143 correspond to the respective steps of FIG. 5.

In step S244, it is determined, by the charge sequencer 1802 which battery needs to be charged. More specifically, the battery to be charged is the one having the lowest charge value.

Once the battery is charged, during steps S141 and S142, it is determined by the charge sequencer 1802 if another battery needs to be charged. If yes, then the next battery to be charged is selected in step S244 as described above. If no, then the extra power is discarded in step S143 as described in FIG. 5.

In this manner, it is ensured that batteries having a lower charge value are recharged with priority. This is advantageous because recharging a battery having its charge value closer to a value corresponding to maximum discharge threshold, rather than a batter having a higher charge value results in fewer charge/discharge cycles, and therefore in an increased battery lifetime.

Battery Discharge

If the result of the determination as step S16 is that the power being converted is not enough to supply the load connected to the node $V_{LDO}$ the load is driven at a step S18 while the battery is discharged at a step S190.

Steps S18 and S190 are executed by a proper connection of switches 1804 by means of charge sequencer 1802. More specifically, in order to drive the load and discharge the battery, node $V_{OUT}$ is connected to node $V_{BATOUT}$ and node $V_{BAT1}$.

The execution of steps S18 and S190 is carried out until it is detected, by means of comparators 1502 and 1303 and priority arbitrator 1601, that the amount of power being converted has changed, and/or until it is detected that the amount of power used by the load has changed, and/or until it is detected, by means of SWAP comparators 1801, that the battery 1201 is discharged at a value corresponding to maximum discharge threshold stored in charge sequencer 1802.

The battery discharge step S190 is composed by steps S191 and S192. Step S191 consists in discharging the battery, by connecting at least $V_{BAT1}$ to $V_{BATOUT}$. At step S192 it is judged, by means of SWAP comparators 1801, whether the battery has been discharged to a value corresponding to the maximum discharge threshold of battery 1201 saved within charge sequencer 1802. If it is judged that the battery has been discharged to at least a value corresponding to the maximum discharge threshold of battery 1201, steps S18 and S190 are interrupted.

Battery discharge for the third alternative to the first embodiment

The discharging operation of the third alternative to the first embodiment, including a plurality of batteries 1201, 4202 and 4203, is illustrated in FIG. 9.

The operation of FIG. 9 differs from the operation of FIG. 5 due to the presence of more than one battery. More specifically, steps S140 and S190 of FIG. 5 are replaced by steps S240 and S290 of FIG. 9.

Discharging step S290 includes step S292, step S191, step S192, and step S294. Step S191 and step S192 correspond to the respective steps of FIG. 5.

In step S294, it is determined, by the charge sequencer 1802 which battery can be discharged. More specifically, the battery to be discharged is the one having the highest charge value.

Once the battery is discharged, to a level corresponding to the maximum discharge threshold, during steps S191 and S192, it is determined by the charge sequencer 1802 if another battery can be discharged in order to keep driving the load. If yes, then the next battery to be discharged is selected in step S294 as described above. If no, then the driving of the load is interrupted.

In this manner, it is ensured that batteries having a higher charge value are discharged with priority. This is advantageous because discharging a battery having its charge value closer to a value corresponding to the minimum charge threshold, rather than a batter having a lower charge value, results in a reduced number of charge/discharge cycles, and therefore in an increased battery lifetime.

Accordingly, the charge/discharge operation, when carried out in the presence of multiple batteries, is advantageous since it provides more flexibility, which results in increased lifetime. In the case of only one battery, when charge is possible or discharge is needed, the system can only charge/discharge the single battery, independently on the charge level in the battery. When having plural batteries, the system can decide which one(s) to charge/discharge so as to try to charge/discharge completely each battery. In this manner, each battery can be operated independently resulting in more flexibility.

For instance, if only one battery having a certain capacity is available, and 40% of the capacity is used to drive the load, when some additional power is converted, so that the discharge of the battery is not needed to drive the load anymore, it might be possible to recharge the battery. However, this implies that the battery will do a 100% to 60% to 100% charge cycle, which might not be ideal.

In the same case, if two batteries having half of the capacity of the single one are used, the first battery may be used to drive the load, resulting in a final charge level corresponding to 30% of the capacity. When the additional power is again available, the battery might be fully recharged, resulting in a charge cycle of 100% to 30% to 100%, while the second battery remains at 100% throughout the entire cycle. This is advantageous since it improves the lifetime of both batteries.

Sleep Mode

In case where the available power generated by the first photovoltaic generator 1101 and/or the energy stored in the batteries is not enough to satisfy the power requirement of the energy converter, the energy converter can be put into a sleep mode. In such an optional sleep mode, only the UVLO 1403 and the comparators 1303 and 1502, as well as the circuits involved in the generation of the reference signals inputted to the comparators, can be kept on. This allows the energy converter to keep following the evolution of the voltages while consuming the smallest amount of power possible.

SECOND EMBODIMENT

Figure 12:
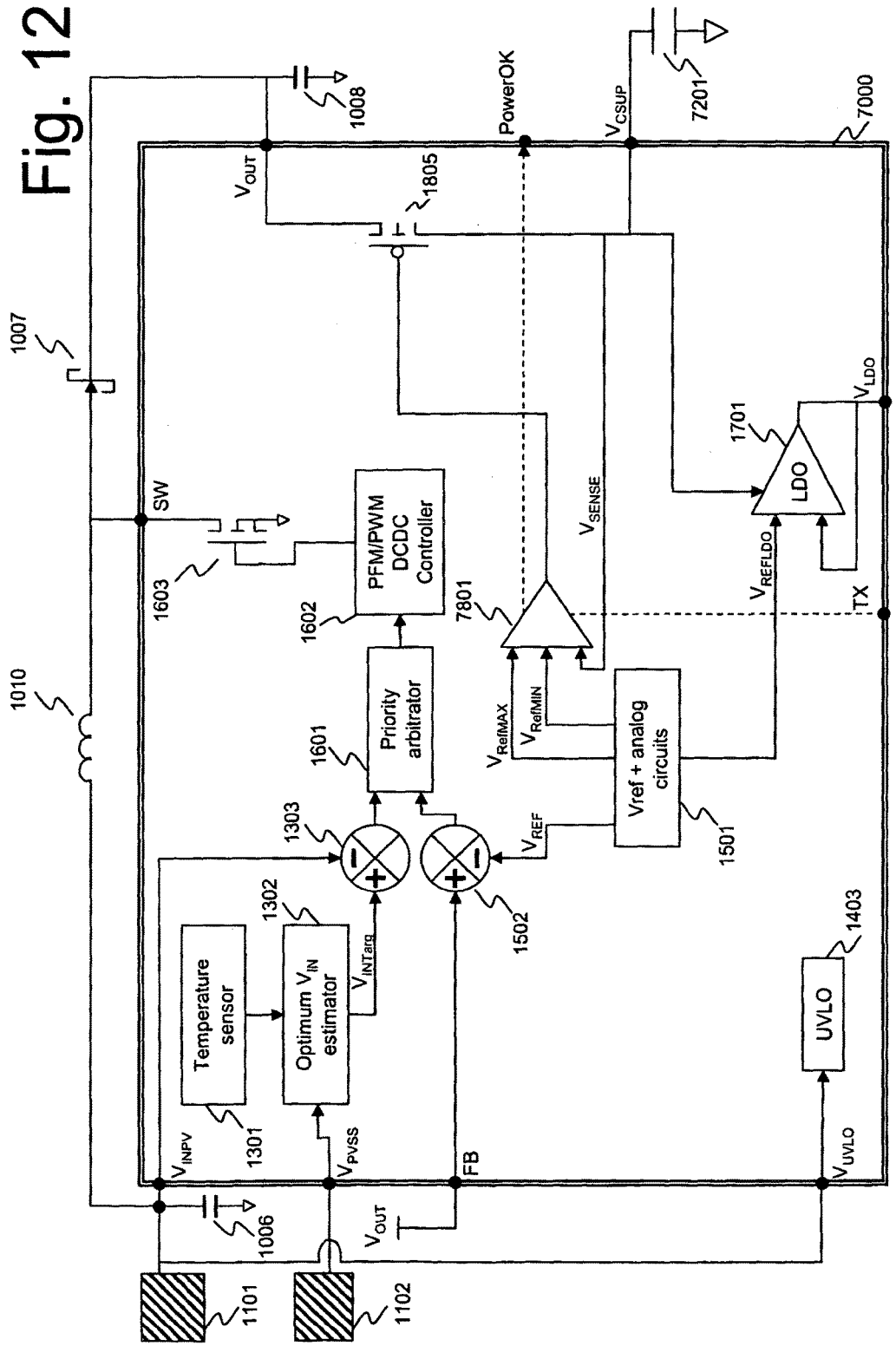
FIG. 12 illustrates a schematic example of an energy converter and an energy conversion and storage system in accordance with a second embodiment of the present invention.

FIG. 12 illustrates a realisation of an energy converter 7000 according to a second embodiment of the present invention. The energy converter 7000 differs from the energy converter 1000 of the first embodiment of the present invention in that the energy is not stored in battery 1201 but in a super capacitor 7201.

The utilization of a super capacitor 7201 instead of battery 1201 mainly requires the output stage of the energy converter to be modified, in order to take advantage of the way in which the super capacitor is capable of providing power. More specifically, the SWAP comparator 7801 of energy converter 7000 has an additional input TX which is used in order to activate a high-power mode which allows bursts of high current to be delivered to the load, via the LDO 1701, from the super capacitor 7201. This is particularly interesting in the case of RF applications which have a periodical need for high power. In addition to the high power bursts provided by the super capacitor, the energy converter 7000 is capable of providing energy harvested by the photovoltaic cell 1101.

The energy converter 7000 may further include a PowerOK output used to signal to the external environment that the super capacitor is charged.

Moreover, the energy converter 7000, does not require components used for recharging batteries, in the first embodiment, such as charge sequencer 1802, charge controller 1803, resistance 1807 and detector 1806.

It is to be understood that the first embodiment and the second embodiment can be combined. This offers several advantages. Power can be provided by the photovoltaic generator 1101. At the same time, potential excessive power can be stored in the batteries or in the super capacitor. If not enough power is available from the photovoltaic cell, power can be retrieved from the batteries and/or the super capacitor, if a stable amount of current is needed, or from the super capacitor, if a high value of current is need. In this manner, operation of the load is ensured at all time, irrespectively of the kind of current consumption required by the load. Additionally, for instance, if only bursts of high current are needed, power could be transferred from the batteries to the super capacitor.

Moreover, the variations of the first embodiment can be applied to the second embodiment, providing the same beneficial effects outlined for the first embodiment.

The operation of the second embodiment is similar to the operation of the first embodiment, except that the super capacitor is charged/discharged instead of the batteries. Since the charging voltage of the super-capacitor does not need to be fixed, as for the batteries, the super capacitor can be always charged in by-pass mode and no linear mode is required. In such a case, the regulation of the input voltage $V_{INPV}$ has priority over the regulation of the output voltage $V_{OUT}$. By giving priority to the regulation of the input voltage, it is guaranteed that the maximum amount of power will be extracted from the photovoltaic generator.

When the second embodiment is combined with the first embodiment, priority between the output and input voltage regulation can be managed as described in the first embodiment during the charge of the batteries, while priority can be managed as described in the second embodiment during the charge of the super capacitor. If the battery and super capacitor are charged at the same time, the priority scheme used for the first embodiment can be implemented for both the capacitor and the batteries.

THIRD EMBODIMENT

Figure 13:
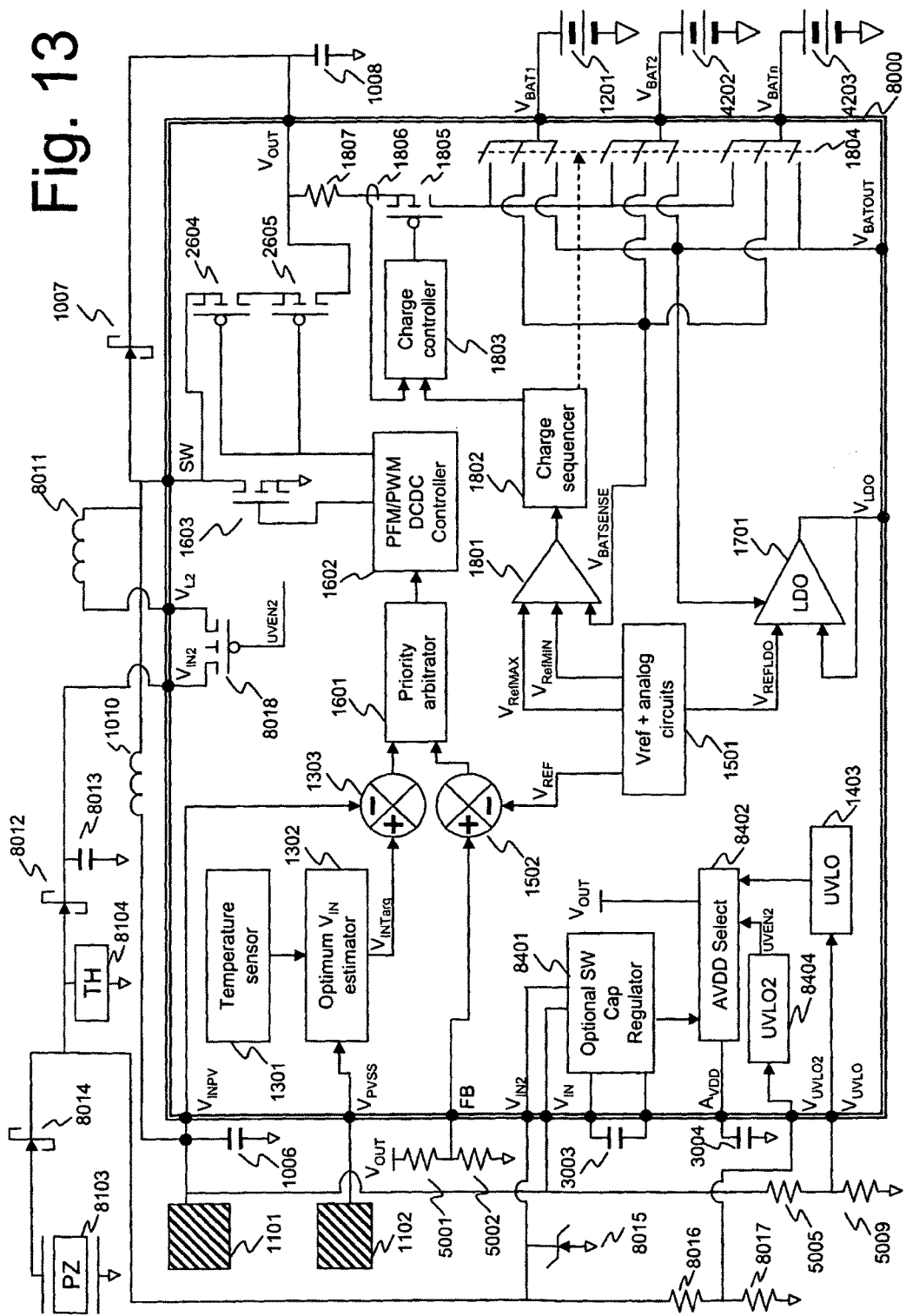
FIG. 13 illustrates a schematic example of an energy converter and an energy conversion and storage system in accordance with a third embodiment of the present invention.

An energy converter 8000 in accordance with a third embodiment of the present invention is represented in FIG. 13.

The energy converter 8000 differs from the energy converter 6000 of the first embodiment due to the presence a piezoelectric generator 8103, a thermoelectric generator 8104 and additional components needed for the operation of those two generators. The specificity of the piezoelectric source is to deliver a AC power limited to a few mW and to have a high loss impedance. A similar behaviour is also applicable to the thermoelectric source.

Moreover, the energy converter 8000 further includes diodes 8014 and 8012, capacitor 8013, switch 8018, inductor 8011, clamp diode 8015, since the piezoelectric generator can create high output voltages, a resistance bridge formed by resistors 8016 and 8017, an optional SW cap regulator 8401, and a AVDD select block 8402 and a UVLO2 8404.

If only the piezoelectric source or only the thermoelectric source are used in energy converter 8000, the operation of the energy converter 8000 differs from the operation of the first embodiment in that priority is given to the regulation of the current flowing through inductor 8011. Once the high threshold $V_{UVLO2H}$ of the UVLO2 8404 is reached by the signal $V_{UVLO2}$, the boost converter will ramp up the output voltage $V_{OUT}$ and, if the energy converter is in battery recharge mode, for instance, the charge sequencer will operate so as to select at least one battery to be charged and charge it by limiting the charge current. In this case, the boost converter can operate in a PWM manner.

Moreover, the charge stored in the input capacitance 8013 is higher than the charge requested by the output capacitance 1008, when charged at the voltage required for recharging the battery. More specifically, the choice of the value of the capacitance 8013 is done so that the UVLO2 is not driven to its lower trigger value once the boost converter is charged. In other words, the value of the capacitance 8013 is enough to guarantee the correct start-up of the boost converter and the charge of the output capacitance 1008, while maintaining a voltage $V_{UVLO2}$ higher than the lower trigger voltage of the UVLO2. In this manner, undesired turn-off of the energy converter 8000 during start up operation, when power is provided only by the piezoelectric source and/or by the thermoelectric source can be achieved.

As mentioned, the battery charge current can be limited by the charger. Alternatively or in addition, if enough power is generated to charge the battery at constant voltage, the charger can be put in by-pass mode and the boost converter can be operated so as to transfer the charge stored in capacitance 8103 to the battery.

If the piezoelectric generator 8103 and/or the thermoelectric generator 8104 is/are used in conjunction with the photovoltaic generator 1101, since input capacitance 8013 can have a capacitance value larger than input capacitance 1006, priority is given, during power-up, to the output of UVLO2 8404 over the output of UVLO 1403. This is because, if the larger input capacitance 8013 signals to have a sufficient charge level, through the switch of UVLO2 8404, the boost converter can drive the output voltage in a faster manner, without waiting for the UVLO 1403 to switch. More generally, speaking, the switch of any of the two UVLO is sufficient for starting the operation of the energy converter.

If all generators are working the photovoltaic generator may provide more power than the others. For instance, the photovoltaic generator may generate order of magnitude more power than the TEG (Thermoelectric Generator) and the piezoelectric generator. So the photovoltaic generator is considered as prioritary in defining the operational state of the energy converter.

Alternatively, or in addition, if there is not enough power to ensure the charging of the batteries at the same time of driving the load, the piezoelectric generator or the TEG can be used to provide power to the batteries.

Alternatively, or in addition, if the photovoltaic generator is not providing energy the TEG or piezoelectric generator can be connected to the output through a charge pump regulator.

Alternatively, instead of a single thermoelectric generator 8012, a plurality of thermoelectric generators 8012 can be connected in series. This provides the additional advantage that the output voltage of the plurality of thermoelectric generators 8012 can be higher than that of a single generator. Moreover, by using such an approach, the design of the energy converter 8000 can be kept simple, since a voltage step-up for the output of thermoelectric generator 8012 is not needed.

The energy converter may be realized without toxic material unadviced for the living organism and environment, for instance, lead P, Bi2Te3 with bismuth, Sb. Instead, it may be realized with silicon, or any eco-friendly material.

The operation of the second and third embodiments are similar to the operation of the first embodiment. That is, the management of the charge/discharge cycles of one or a plurality of energy storage elements is similar, independently on the kind of generator used and independently on the kind of energy storage element used.

The present invention relates to an energy converter capable of converting energy received from a plurality of generators which are capable of harvesting power from the environment. One of such generator can be, for instance, a photovoltaic generator. In such cases, the energy converter of the present invention is configured so as to receive as a first input, the output of the first photovoltaic generator. Moreover, the energy converter is configured to receive a second input, from a second generator, from instance, a second photovoltaic generator. The first input of the energy converter can be used so as to receive energy from the first photovoltaic generator which can be converted by the energy converter. At the same time, the second input of the energy converter can be used so as to receive an open circuit voltage from the second photovoltaic generator. In such a manner, it is possible to sense a precise value of the open circuit voltage of the second photovoltaic generator and use this value as an estimation of the open circuit voltage of the first photovoltaic generator.

By using the sensed open circuit voltage, it is possible to estimate a value at which the voltage output by the first photovoltaic generator should be maintained to improve power efficiency. In other words, by referring to the sensed open circuit voltage of the second photovoltaic generator, the energy converter can convert energy received from the first photovoltaic generator in such a manner than the voltage outputted by the first photovoltaic generator is kept to a level which improves the amount of power generated by the first photovoltaic generator.

Using such an approach, the energy converter of the present invention is capable of extracting power from the first photovoltaic generator that is close to the optimum without requiring a complex solution such as the one represented by the MPPT technique.

Figure 14:
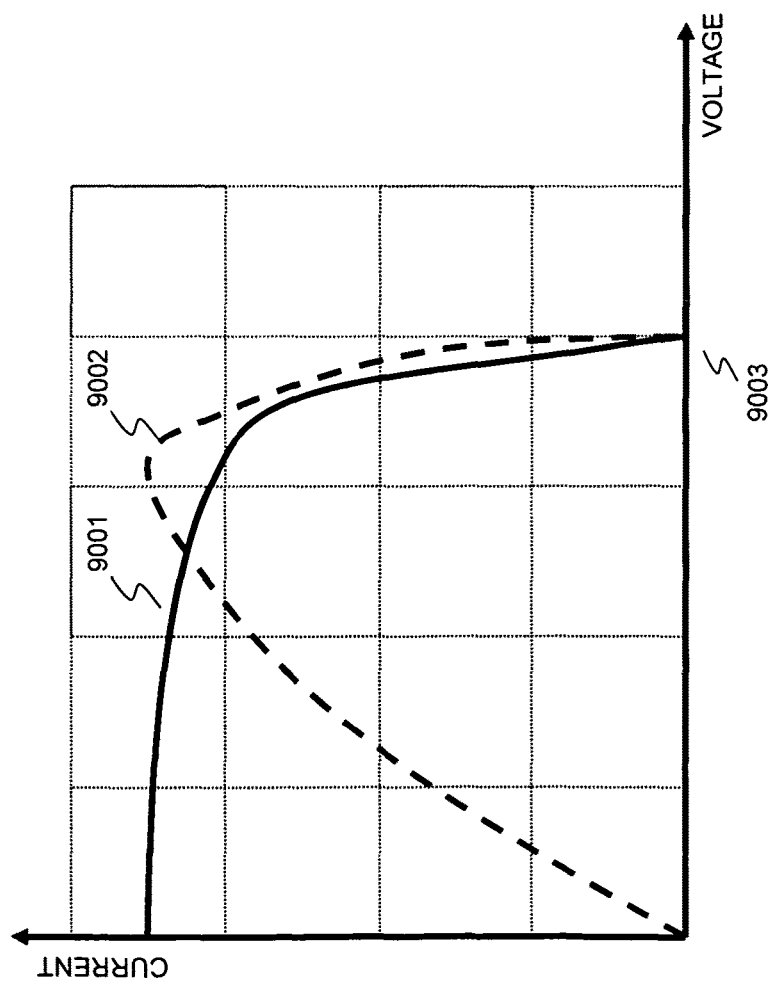
FIG. 14 illustrates a schematic diagram of the output current and power as a function of the output voltage for a photovoltaic generator.

More generally speaking, although the embodiments of the invention have been explained with reference to a photovoltaic generator, the present invention is not limited to this and can be applied to any generator having a voltage-current characteristic similar to the one illustrated in FIG. 14.

Moreover, the energy converter of the present invention can be configured so as to harvest power from an additional thermal electric generator and/or an additional piezoelectric generator. Even when the energy converter of the present invention is realised so as to harvest power from the three mentioned generators, the architecture of the energy converter of the present invention is maintained simple so as to require only a reduced amount of power in order to operate compared to the MPPT technique.

Additionally, the present invention can relate to an energy conversion and storage system, including the energy converter and at least one energy storage element.

Furthermore, although in FIGS. 4-14 the current detector 1806 is represented between the node $V_{OUT}$ and the transistor 1805, the present invention is not limited to this. Alternatively, or in addition, the current detector 1806 could be placed between the transistor 1805 and the battery 1201. Still alternatively, or in addition, the current detector 1806 could be placed between the diode 1007 and the node $V_{OUT}$.

Moreover, the embodiments are explained with reference to a boost converter. However, the present invention is not limited to this. Instead of a boost converter, a buck converter could be used. Still alternatively, a buck-boost converter could be used. The decision to operate the converter in a boost (step-up) or buck (step-down) manner can be made before or after the estimation of the optimal output voltage of the first generator. Such a decision is implemented by comparing the first generator output voltage, before or after optimization done by taking into account the second generator, $V_{INPV}$, with the battery voltage $V_{INPV}$ and/or the output voltage $V_{OUT}$.

For example while operating, $V_{INPV}$ could be equal to 20V and $V_{BAT}$ could be equal to 4V at a certain time. Then a buck-boost converter can be operated in a buck mode (downconversion). While, at a different time, $V_{INPV}$ could be equal to 3V and $V_{BAT}$ could be equal to 4V, then a buck-boost converter could be operated in a boost mode (upconversion). This is advantageous in that it provides flexibility depending on the voltage currently outputted by the first photovoltaic generator.

Alternatively, or in addition, if the voltage value of the first photovoltaic generator is, by design, maintained at $V_{INPV}$=20V and $V_{BAT}$=4V, a buck converter can be implemented instead of a buck-boost converter.

Still alternatively, or in addition, if the voltage value of the first photovoltaic generator is, by design, maintained at $V_{INPV}$=3V and $V_{BAT}$=4V, a boost converter can be implemented instead of a buck-boost converter.

Still alternatively, or in addition, a plurality first photovoltaic generators 1101 could be used and the connection between the generators and the energy converter could be electronically controlled so as to be a parallel or a series connection. More specifically, some generators in a group could be connected in parallel and the group could be connected in series to another generator, or a group of generators. More generally, any connection between any two generators could be achieved. In this manner, depending on the required output voltage, the connections between the generators could be controlled so as to provide a $V_{INPV}$ having the closest value to the required output voltage.

For instance, if 5 generators are used, each providing 4V and the required $V_{BAT}$ is 3V then the generators could be connected in parallel. On the other hand, if each is providing 4V and the required $V_{BAT}$ is 4V, they could be connected in series. Moreover, if each is providing 2V and the required $V_{BAT}$ is 4V, the generators could be connected two be two in series and the two series-connected group, could be connected to each other in parallel.

Although, in the Figures, the nodes $V_{BATOUT}$ and $V_{LDO}$ are illustrated as floating, the present invention is not limited to this. For instance, they could each be connected to a decoupling capacitor having its other node connected to a reference voltage, for instance to the ground voltage.

The invention claimed is:

1. An energy converter, connectable to at least one first generator, for converting energy received from the at least one first generator, wherein
the energy converter is connectable to a second generator;
the energy converter includes a sensing unit configured to sense an output value of the second generator which allows the estimation of the open circuit voltage of the first generator;
the energy converter is configured to convert energy received from the first generator based on the open circuit voltage estimated by the sensing unit; and
the energy converter configured to be connected to at least one energy storage element.

2. The energy converter according to claim 1 wherein the sensed output value of the second generator is the open circuit voltage value of the second generator.

3. The energy converter according to claim 2 wherein
the sensing unit is configured to output a optimized voltage ($V_{INTarg}$) corresponding to a value in a range of 5% to 35% less than the sensed open circuit voltage, and
the energy converter is configured to maintaining an output voltage ($V_{INPV}$) of the first generator to a value corresponding to the optimized voltage.

4. The energy converter according to claim 1 further comprising a converter selected from the group of a boost converter, a buck converter, and a buck-boost converter, controlled by a controller, configured to convert the output voltage of the first generator to an output voltage ($V_{OUT}$) of the energy converter corresponding to a predetermined reference voltage ($V_{REF}$).

5. The energy converter according to claim 4 further comprising a priority arbitrator configured to
a. receive a first error signal, output by a first comparator, indicating the difference between the optimized voltage and the output voltage of the first generator;
b. receive a second error signal, output by a second comparator, indicating the difference between the reference voltage and the output voltage of the energy converter; and
c. output a control signal to the controller, thereby driving the converter, so as to
i. ensure that the second error signal is minimized if the first error signal is within a predetermined range, indicating that the first generator is capable of providing as much power as required by the converter, and
ii. ensure that the first error signal is minimized if the first error signal is detected outside the predetermined range.

6. The energy converter according to claim 1, wherein the at least one energy storage element includes at least one battery.

7. The energy converter according to claim 1, wherein the at least one energy storage element includes at least one super-capacitor.

8. The energy converter according to claim 1 further comprising a voltage regulator configured so as to provide a regulated output of the energy converter by drawing energy from
a. the output voltage ($V_{OUT}$) of the energy converter; and/or
b. the at least one energy storage element.

9. The energy converter according to claim 1 wherein the first generator includes a first photovoltaic generator and the second generator includes a second photovoltaic generator.

10. The energy converter according to claim 9 wherein
the first photovoltaic generator and the second photovoltaic generator are parts of a single photovoltaic cell, wherein the photovoltaic cell has a first output for the first photovoltaic generator and a second output for the second photovoltaic generator.

11. The energy converter according to claim 1 further including at least one third generator, wherein the at least one third generator includes at least one of
a. a piezoelectric generator; and
b. a thermoelectric generator.

12. An energy conversion and storage system including
a. an energy converter according to claim 1;
b. at least one energy storage element, wherein the at least one energy storage element includes at least one of
i. at least one battery, and
ii. at least one super-capacitor.

13. The energy conversion and storage system according to claim 12 wherein the energy converter and the at least one energy storage element are realized with bio-compatible materials.

14. An energy conversion method, for converting energy received from at least one first generator, the method comprising:
   sensing an output value of a second generator;
   estimating the open circuit voltage of the first generator based on the sensed output value of the second generator; and
   converting energy received from the first generator based on the estimated open circuit voltage,
   wherein an energy converter is configured to be connected to at least one energy storage element.

15. The energy converter according to claim 1 wherein
   the sensing unit is configured to output a optimized voltage ($V_{INTarg}$) corresponding to a value in a range of 15% to 20% less than the sensed open circuit voltage, and
   the energy converter is configured to maintaining an output voltage ($V_{INPV}$) of the first generator to a value corresponding to the optimized voltage.

* * * * *